United States Patent
Lesso

(10) Patent No.: US 8,514,025 B2
(45) Date of Patent: Aug. 20, 2013

(54) AMPLIFIER CIRCUIT AND METHOD OF AMPLIFYING A SIGNAL IN AN AMPLIFIER CIRCUIT

(75) Inventor: John Paul Lesso, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 0 days.

(21) Appl. No.: 13/490,070

(22) Filed: Jun. 6, 2012

(65) Prior Publication Data

US 2012/0242413 A1 Sep. 27, 2012

Related U.S. Application Data

(63) Continuation of application No. 12/671,656, filed on Feb. 1, 2010, now Pat. No. 8,198,941.

(30) Foreign Application Priority Data

| Aug. 3, 2007 | (GB) | 0715254.9 |
| Aug. 30, 2007 | (GB) | 0716920.4 |
| Aug. 30, 2007 | (GB) | 0716923.8 |
| Oct. 31, 2007 | (GB) | 0721431.5 |
| Apr. 9, 2008 | (GB) | 0806471.9 |

(51) Int. Cl.
*H03F 3/04* (2006.01)

(52) U.S. Cl.
USPC ............. 330/297; 330/127; 330/310; 363/60; 327/536

(58) Field of Classification Search
USPC ............ 327/536; 330/297, 127, 310; 363/60
See application file for complete search history.

(56) References Cited

U.S. PATENT DOCUMENTS

| 4,077,013 A | 2/1978 | Morez et al. |
| 4,873,493 A | 10/1989 | Fujiwara |
| 5,059,921 A | 10/1991 | Vyne et al. |
| 5,229,721 A | 7/1993 | Stade |
| 5,420,536 A | 5/1995 | Faulkner et al. |
| 5,442,317 A | 8/1995 | Stengel |
| 5,834,977 A | 11/1998 | Maehara et al. |
| 5,898,340 A | 4/1999 | Chatterjee et al. |
| 5,929,702 A | 7/1999 | Myers et al. |
| 6,307,357 B1 | 10/2001 | Botti et al. |
| 6,349,216 B1 | 2/2002 | Alberth, Jr. et al. |
| 6,452,716 B1 | 9/2002 | Park et al. |
| 6,650,555 B2 * | 11/2003 | Suzuki et al. ................. 363/60 |

(Continued)

FOREIGN PATENT DOCUMENTS

| EP | 0 739 089 A2 | 10/1996 |
| JP | 55-64408 A | 5/1980 |

(Continued)

*Primary Examiner* — Patricia Nguyen
(74) *Attorney, Agent, or Firm* — Dickstein Shapiro LLP

(57) ABSTRACT

An amplifier circuit, comprising: an input, for receiving an input signal to be amplified; a power amplifier, for amplifying the input signal; a switched power supply, having a switching frequency, for providing at least one supply voltage to the power amplifier; and a dither block, for dithering the switching frequency of the switched power supply. The dither block is controlled based on the input signal. Another aspect of the invention involves using first and second switches, each having different capacitances and resistances, and using the first or second switch depending on the input signal or volume signal. Another aspect of the invention involves controlling a bias signal provided to one or more components in the signal path based on the input signal or volume signal.

30 Claims, 19 Drawing Sheets

(56) References Cited

U.S. PATENT DOCUMENTS

| | | |
|---|---|---|
| 6,788,151 B2 | 9/2004 | Shvarts et al. |
| 6,825,726 B2 | 11/2004 | French et al. |
| 6,894,559 B1 | 5/2005 | Dolman |
| 6,963,189 B2 | 11/2005 | Nielsen et al. |
| 6,995,995 B2 | 2/2006 | Zeng et al. |
| 7,157,963 B1 | 1/2007 | Booth et al. |
| 7,196,584 B2 | 3/2007 | Harris |
| 7,277,136 B2 | 10/2007 | Keller |
| 7,474,141 B2 * | 1/2009 | Huang et al. ............... 327/536 |
| 7,714,661 B2 | 5/2010 | Doy et al. |
| 7,830,209 B1 | 11/2010 | Woodford et al. |
| 7,834,707 B2 * | 11/2010 | Chien ........................ 331/17 |
| 7,839,218 B2 | 11/2010 | Shimamoto et al. |
| 8,264,273 B2 * | 9/2012 | MacFarlane ............... 327/536 |
| 2002/0075069 A1 | 6/2002 | Karki et al. |
| 2005/0110562 A1 | 5/2005 | Robinson et al. |
| 2005/0212497 A1 | 9/2005 | Cha |
| 2005/0271161 A1 | 12/2005 | Staszewski et al. |
| 2006/0012434 A1 | 1/2006 | Takahashi et al. |
| 2006/0015199 A1 | 1/2006 | Ebi et al. |
| 2007/0178860 A1 | 8/2007 | Sutardja |
| 2007/0223738 A1 | 9/2007 | North |
| 2012/0212293 A1 * | 8/2012 | Khlat ........................... 330/127 |

FOREIGN PATENT DOCUMENTS

| | | |
|---|---|---|
| JP | 9-266426 A | 10/1997 |
| JP | 11-27055 A | 1/1999 |
| JP | 11-150943 A | 6/1999 |
| JP | 2000-49541 A | 2/2000 |
| JP | 2003-79135 A | 3/2003 |
| WO | WO 99/56383 A1 | 11/1999 |
| WO | WO 00/55968 A1 | 9/2000 |

* cited by examiner

AMPLIFIER CIRCUIT AND METHOD OF AMPLIFYING A SIGNAL IN AN AMPLIFIER CIRCUIT

This is a continuation of application Ser. No. 12/671,656, filed Sep. 29, 2008, now U.S. Pat. No. 8,198,941, the entirety of which is incorporated herein by reference.

This invention relates to amplifier circuits, and in particular but not exclusively to amplifier circuits that include power amplifiers.

BACKGROUND

FIG. 1 shows a basic Class AB amplifier 10. A bipolar (i.e. split level) power supply outputs the voltages $V_+$, $V_-$ and these output voltages are applied across the amplifier 10, which amplifies an input signal $S_{in}$ and outputs a ground-referenced amplified output signal $S_{out}$ to a load 20. Provided the voltages $V_+$, $V_-$ supplied to the amplifier 10 are sufficient, the amplifier 10 has a substantially linear amplification (ignoring crossover effects). That is, the voltages $V_+$, $V_-$ output from the power supply must be adequate so as to avoid output signal "clipping", i.e. attenuation of the output when the signal nears, equals or exceeds the voltages $V_+$, $V_-$ output from the power supply to the amplifier. This is avoided by having "headroom" between the maximum output signal $S_{outmax}$ and the power supply rails.

FIG. 2 is a graph showing $S_{out}$ where $S_{in}$ is a sine wave.

In this example, $V_+$ and $V_-$ are set sufficiently high so that the input sine wave is linearly amplified. That is, there is a small amount of headroom between $V_+$ and $V_-$ and the maximum output signal, so that the signal is not clipped.

The shaded region of the graph is representative of the power wasted in the amplifier 10; it can be seen that the amplifier 10 is very efficient when the output is close to $V_+$ or $V_-$, but very inefficient when the output is close to 0V (GND). That is, a large amount of power is still being expended by the amplifier 10 even when the output signal $S_{out}$ is small. The maximum theoretical efficiency for a class AB amplifier is 78.5%.

Class G amplifiers overcome this limitation on efficiency by providing more than one set of power supply rails, i.e. supply voltages. That is, as shown in FIG. 3, the amplifier may run off one power supply $V_+$-$V_-$ if the output signal $S_{out}$ is relatively large, or another smaller power supply $V_p$-$V_n$ if the output signal $S_{out}$ is relatively small. Ideally, an infinite number of power supply rails would be provided, such that the voltage supplied to the amplifier effectively "tracks" the input signal, always providing just enough voltage so that there is no clipping.

FIG. 4 shows an example of a Class G amplifier 50.

In this example the signal source is digital in nature so a digital signal $S_{in}$ to be amplified is input to the amplifier 50. The digital input signal is first converted to an analogue signal by a digital-to-analogue converter (DAC) 51. The resulting analogue signal is fed to an envelope detector 52. The envelope detector 52 detects the size of the envelope of the analogue output signal of the DAC 51, and outputs a control signal to a switching DC-DC converter 54. The control signal is indicative of the magnitude of the envelope of the analogue output of the DAC 51. The DC-DC converter 54 then supplies voltages $V_+$ and $V_-$ to a power amplifier 56 by charging respective capacitors 58, 60. The voltages $V_+$ and $V_-$ supplied by the DC-DC converter 54 vary with the control signal from the envelope detector 52, such that a relatively large envelope will lead to relatively high voltages supplied to the power amplifier 56; conversely, a small envelope will lead to relatively small voltages being supplied to the power amplifier 56, so that less power is wasted.

$V_+$ is supplied to one terminal of a first capacitor 58, and $V_-$ is supplied to one terminal of a second capacitor 60. The second terminals of the respective capacitors 58, 60 are connected to ground. The DC-DC converter 54 is switched on and off at a fixed frequency $F_s$, so that the capacitors 58, 60 are alternately charged and discharged, with an approximately constant voltage being applied to the power amplifier 56 provided the envelope of the analogue signal does not change.

FIG. 5 is a schematic graph illustrating the voltage across one of the capacitors 58, 60. At time $t_0$, the DC-DC converter 54 is switched on and the capacitor begins to charge. At time $t_1$, the DC-DC converter 54 is switched off and the capacitor begins to discharge. At time $t_2$, the DC-DC converter 54 is switched on and the capacitor begins to charge again. This action repeats, such that the voltage across the capacitor is maintained at an approximately constant level, with a small amount of variation known as the "ripple voltage". The time period between $t_0$ and $t_2$ is $1/F_s$.

In parallel with the envelope detection discussed above, the analogue output signal of the DAC 51 in FIG. 4 is fed through an analogue delay 62 to a preamplifier 63, typically a programmable gain amplifier (PGA), which amplifies the delayed signal by a gain set in accordance with a received control signal (i.e. the volume). The output from the preamplifier 63 is fed to the power amplifier 56, where it is amplified and output to a load 64. The analogue delay 62 is necessary so that the power modulation achieved by the envelope detection is synchronized with the signal arriving at the power amplifier 56.

However, analogue delays often cause distortion of the signal; the longer the delay that is required, the worse the distortion of the delayed signal. Conventionally, to minimize this effect, the envelope detection and power modulation must be made to operate as quickly as possible; that is, the DC-DC converter 54 must react quickly to changes in the input signal envelope. However, this approach also has drawbacks. For example, where the power amplifier 56 is used to amplify an audio signal, a DC-DC converter that operates at the frequencies necessary to reduce distortion in the signal may itself generate noise tones that are audible to a user. In practice, a compromise needs to be reached between distortion of the signal and noise generated by the power supply.

As described above in FIG. 5, the voltage across the capacitors 58, 60 rises and falls periodically as the DC-DC converter 54 is switched on and off at a certain clock frequency, giving rise to a "ripple voltage". A problem with such systems is that the ripple voltage tends to generate "tones" at the clock frequency and its harmonics. The greater the ripple voltage, the greater the amplitude of the tones created. In general, such tones are undesirable and may disturb the operation of other systems on the chip. In audio applications, such tones may mix into audio frequencies, and be audible to the user.

A standard method of reducing the tones caused by switching in the power supply is to dither the switching frequency. That is, by adding a noise signal to the clock signal, the switching frequency may be continuously adjusted slightly up or down. This has the effect of "spreading out" the energy generated at the clock frequency and its harmonics to cover a broader range of frequencies around those discrete values. This lessens the amplitude of the tones, reducing their impact on other systems and the end user.

However, power is required to generate dither. This is particularly a disadvantage in portable applications, where battery life is an important consideration for manufacturers. In addition, the dither added to the switching frequency may actually cause unwanted noise in the other systems on the chip, i.e. because the DC-DC converter 54 is not switching at the "optimum" frequency.

SUMMARY OF INVENTION

According to one aspect of the present invention, there is provided an amplifier circuit, comprising: an input, for receiving an input signal to be amplified; a power amplifier, for amplifying the input signal; a switched power supply, having a switching frequency, for providing at least one supply voltage to the power amplifier; and a dither block, for dithering the switching frequency of the switched power supply. The dither block is controlled based on the input signal.

According to a related aspect of the present invention, there is provided a method of amplifying a signal in an amplifier circuit, said amplifier circuit comprising a power amplifier and a switched power supply. The method comprises: receiving an input signal; providing at least one supply voltage from the switched power supply to the power amplifier, and amplifying the input signal in the power amplifier. The providing step comprises: switching the switched power supply at a switching frequency; and, on the basis of the input signal, dithering the switching frequency.

According to another aspect of the present invention, there is provided an amplifier circuit, comprising: an input, for receiving an input signal to be amplified; a pre-amplifier, for receiving the input signal and outputting a pre-amplified signal in accordance with a volume signal; a power amplifier, for amplifying the input signal; a switched power supply, having a switching frequency, for providing at least one supply voltage to the power amplifier; and a dither block, for dithering the switching frequency of the switched power supply. The dither block is controlled based on the volume signal.

According to a related aspect of the present invention, there is provided a method of amplifying a signal in an amplifier circuit, said amplifier circuit comprising a power amplifier and a switched power supply. The method comprises: receiving an input signal; preamplifying the input signal on the basis of a volume signal; providing at least one supply voltage from the switched power supply to the power amplifier, and amplifying the input signal in the power amplifier. The step of providing comprises: switching the switched power supply at a switching frequency; and, on the basis of the volume signal, dithering the switching frequency.

According to another aspect of the present invention, there is provided an amplifier circuit, comprising: an input, for receiving an input signal to be amplified; a preamplifier, for amplifying the input signal based on a volume signal; a power amplifier for amplifying the signal output from the preamplifier; and a switched power supply for supplying one or more supply voltages to the power amplifier, said switched power supply comprising a plurality of switches, said plurality of switches comprising a first switch having a first capacitance and a first resistance, and a second switch having a second capacitance and a second resistance, said first capacitance being greater than the second capacitance, said first resistance being less than said second resistance; wherein, when the volume signal is a first value said first switch is selected for use in said switched power supply, and when the volume signal is a second value said second switch is selected for use in said switched power supply.

According to a related aspect of the present invention, there is provided a method of amplifying a signal. The method comprises the steps of receiving an input signal; amplifying the input signal in a preamplifier in accordance with a volume signal; supplying at least one supply voltage from a switched power supply to a power amplifier; and amplifying the signal output from the preamplifier in the power amplifier, wherein the switched power supply comprises a plurality of switches, said plurality of switches comprising a first switch having a first capacitance and a first resistance, and a second switch having a second capacitance and a second resistance, the first capacitance being greater than the second capacitance, and the first resistance being less than the second resistance, the switched power supply operating with the first switch when the volume signal is a first value, and operating with the second switch when the volume signal is a second value.

According to another aspect of the present invention, there is provided an amplifier circuit, comprising: an input, for receiving an input signal to be amplified; a power amplifier for amplifying the input signal; and a switched power supply for supplying one or more supply voltages to the power amplifier, said switched power supply comprising a plurality of switches, said plurality of switches comprising a first switch having a first capacitance and a first resistance, and a second switch having a second capacitance and a second resistance, said first capacitance being greater than the second capacitance, said first resistance being less than said second resistance; wherein when the input signal is a first value said first switch is selected for use in said switched power supply, and when the input signal is a second value said second switch is selected for use in said switched power supply.

According to a related aspect of the invention, there is provided a method of amplifying a signal. The method comprises the steps of: receiving an input signal; supplying at least one supply voltage from a switched power supply to a power amplifier; and amplifying the input signal in the power amplifier, wherein the switched power supply comprises a plurality of switches, said plurality of switches comprising a first switch having a first capacitance and a first resistance, and a second switch having a second capacitance and a second resistance, the first capacitance being greater than the second capacitance, and the first resistance being less than the second resistance, the switched power supply operating with the first switch when the input signal is a first value, and operating with the second switch when the input signal is a second value.

According to another aspect of the present invention, there is provided an amplifier circuit, comprising: an input, for receiving an input signal to be amplified; a playback path comprising one or more components, for receiving the input signal and amplifying the input signal; and a bias generator for generating at least one bias and providing the at least one bias to at least one of the one or more components in the playback path; wherein the at least one bias supplied by the bias generator is controlled based on the input signal.

According to a related aspect of the invention, there is provided a method of amplifying a signal in an amplifier circuit, said amplifier circuit comprising a playback path for receiving an input signal and amplifying said input signal, said playback path comprising one or more components. The method comprises the steps of: receiving the input signal; and providing at least one bias to at least one of the one or more components; wherein the at least one bias is controlled based on the input signal.

According to another aspect of the present invention, there is provided an amplifier circuit, comprising: an input, for receiving an input signal to be amplified; a playback path comprising one or more components, for receiving the input signal and amplifying the input signal, said one or more components comprising a preamplifier for receiving a volume signal and preamplifying the input signal based on said volume signal; and a bias generator for generating at least one bias and providing the at least one bias to at least one of the one or more components in the playback path; wherein the at least one bias supplied by the bias generator is controlled based on the volume signal.

According to a related aspect of the invention, there is provided a method of amplifying a signal in an amplifier circuit, said amplifier circuit comprising a playback path for receiving an input signal and amplifying said input signal, said playback path comprising one or more components, said one or more components comprising at least a preamplifier. The method comprises the steps of: receiving the input signal; preamplifying the input signal in the preamplifier, based on a volume signal; and providing at least one bias to at least one of the one or more components; wherein the at least one bias is controlled based on the volume signal.

BRIEF DESCRIPTION OF THE DRAWINGS

For a better understanding of the present invention, and to show more clearly how it may be carried into effect, reference will now be made, by way of example, to the following drawings, in which.

DETAILED DESCRIPTION

Figure 6:
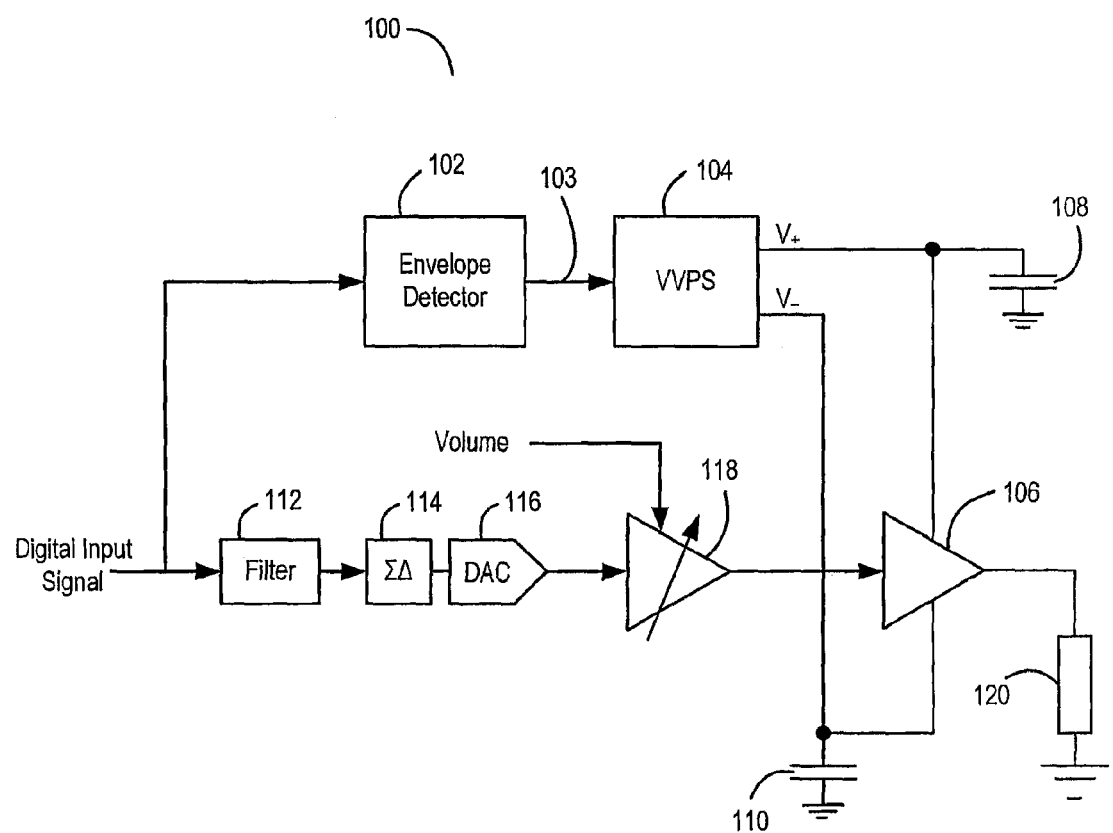
FIG. 6 shows an amplifier.

FIG. 6 shows an amplifier 100 for use in amplifying audio signals. However, it will be appreciated that the amplifier 100 can be used for amplifying many other types of signal.

The amplifier 100 receives a digital input signal to be amplified. The digital input signal is input to an envelope detector 102. The envelope detector 102 detects the amplitude of the envelope of the digital input signal and outputs a control signal 103 to a variable voltage power supply (VVPS) 104. The control signal 103 output to the VVPS 104 is indicative of the size of the detected envelope. The VVPS 104 in turn provides two voltages $V_+$ and $V_-$ to a power amplifier 106 by charging respective capacitors 108, 110. As the control signal 103 from the envelope detector 102 varies, the voltages $V_+$ and $V_-$ supplied by the VVPS 104 vary such that a control signal indicative of a relatively large envelope will lead to relatively high voltages being supplied to the power amplifier 106; conversely, a control signal indicative of a relatively small envelope will lead to relatively small voltages being supplied to the power amplifier 106, so that less power is wasted.

$V_+$ is supplied to one terminal of a first capacitor 108, and $V_-$ is supplied to one terminal of a second capacitor 110. The second terminals of the respective capacitors 108, 110 are connected to ground. The VVPS 104 is switched on and off at a frequency $F_s$, so that the capacitors 108, 110 are alternately charged and discharged, with approximately constant voltages being supplied to the power amplifier 106, provided the envelope of the digital input signal does not change.

The control signal 103 may have a high number of bits, for representing the size of the envelope with a high degree of accuracy. Alternatively, the control signal 103 may have only a single bit.

In parallel with the envelope detection, the digital input signal is input to a digital filter 112. The filtered signal is then input to a sigma-delta ($\Sigma\Delta$) modulator 114. The modulated filtered signal is input to a digital-to-analogue converter (DAC) 116, and converted to an analogue signal.

The effect of the filter 112, sigma-delta modulator 114 and DAC 116 is to convert the digital signal to an analogue signal so that it may be amplified, and to delay the signal so that its arrival at the power amplifier 106 is synchronized with the correct voltage levels as determined by the envelope detector 102. Thus in principle all that is required is a digital delay and a DAC. In the example shown in FIG. 6, the delay is primarily introduced in the digital filter 112, although the sigma-delta modulator 114 and DAC 116 also have inherent delays. The sigma-delta modulator 114 reduces the word length of the input signal as will be familiar to those skilled in the art. This simplifies the DAC 116, as the input signal may be complex (audio signals typically have 24 bits), and designing a 24-bit DAC is very difficult. By reducing the word length using the sigma-delta modulator 114, or any other suitable word-length reduction block, the design of the DAC 116 is greatly simplified. The sigma-delta modulator 114 requires that the signal be upsampled, and this is the purpose of the digital filter 112.

The analogue output signal of the DAC 116 is input to a preamplifier 118 that amplifies the signal by a variable gain. The variable gain is set by a control signal, which in this particular example is the volume signal. In the majority of audio applications, the variable gain will typically be an attenuation, in order to improve the signal to noise ratio (SNR).

The preamplified signal is output from the preamplifier 118 to the power amplifier 106, where it is amplified and output to a load 120, such as, for example, a speaker, a set of headphones, or a line-out connector.

Figure 1:
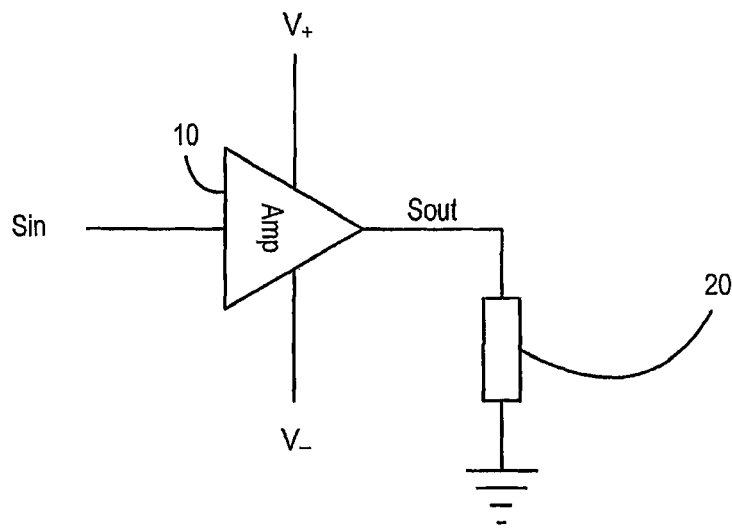
FIG. 1 shows a basic class AB amplifier.
Figure 2:
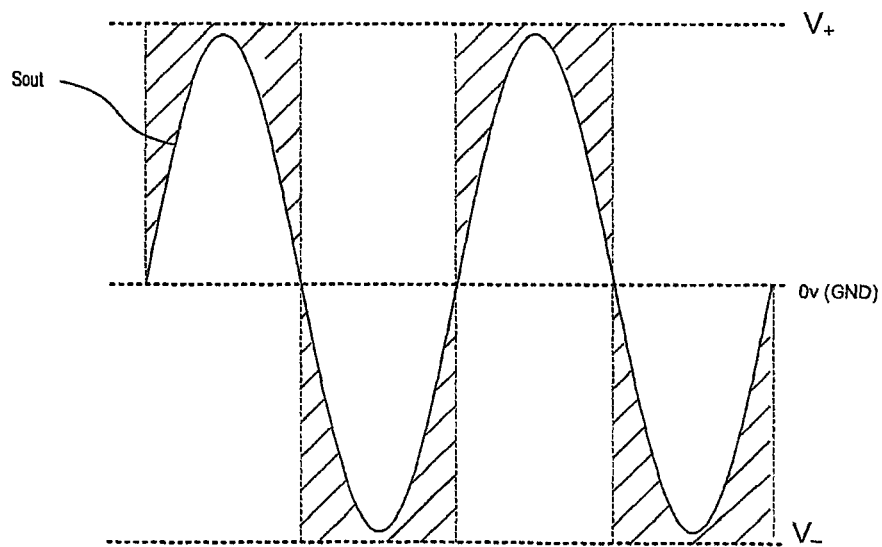
FIG. 2 shows an output signal from the amplifier of FIG. 1 when the input signal is a sine wave.
Figure 3:
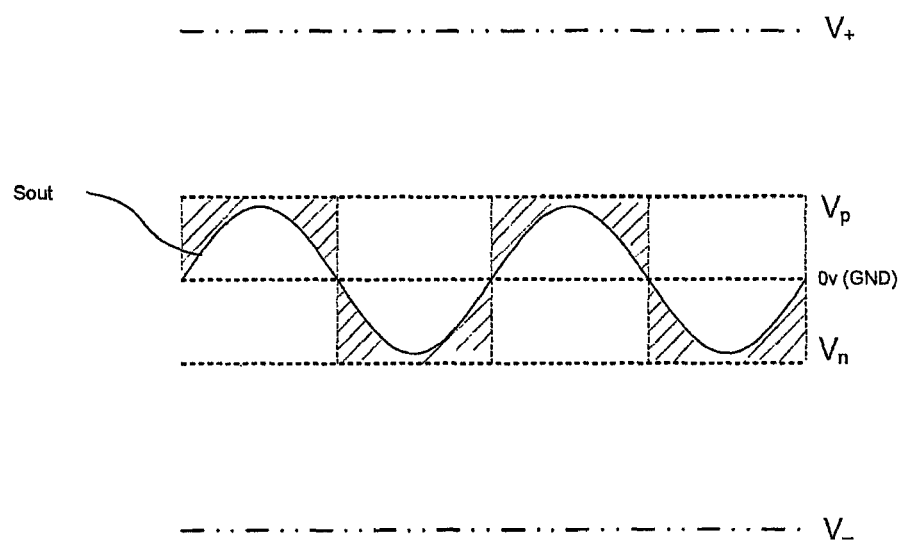
FIG. 3 illustrates dual supply rails used in an amplifier.
Figure 4:
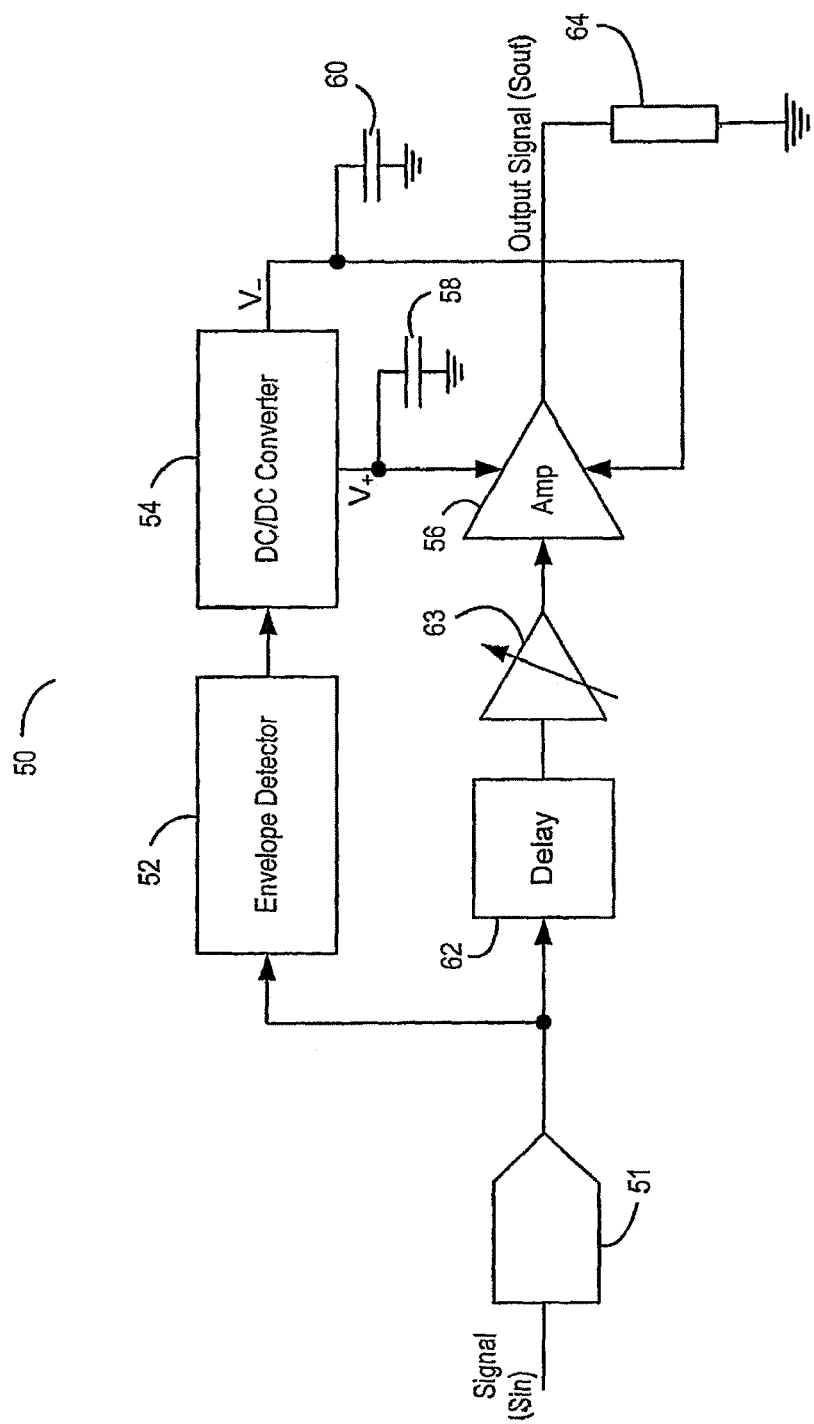
FIG. 4 shows a typical class G amplifier.

The amplifier 100 has a number of advantages over the amplifier 50 described with respect to FIG. 4. By detecting the envelope of the digital input signal, the amplifier 100 can make use of digital delays to delay the signal in parallel to the envelope detection. Digital delays are easy to implement and do not lead to distortion of the signal. Further, the digital delay can be easily adapted so the VVPS 104 need not operate as quickly as in the prior art, and so no tones are generated that may be audible to the user.

As described above, the digital delay can be realized using one or more processes that have an inherent delay. For example, the arrangement shown in FIG. 6 (i.e. the combination of the digital filter 112 and the sigma-delta modulator 114) simplifies the DAC 116 and also delays the signal; however, equalizer circuitry could be used to modulate and delay the signal; alternatively stereo or 3D processing would also delay the signal. This list is not exhaustive, however; any process or combination of processes that delays the signal could be used. It will also be appreciated that the delay could be provided by the DAC 116 alone.

The envelope detector 102 may take a number of forms that would be familiar to a person skilled in the art. For example, the envelope detector 102 may detect the envelope and compare it with some threshold value. In the case where the control signal 103 is only a single bit, the envelope detector 102 may comprise a comparator, that compares the envelope with a threshold value. If the envelope is below the threshold, the VVPS 104 will provide a relatively low voltage; if the envelope is above the threshold, the VVPS 104 will provide a relatively high voltage.

According to another example, the control signal 103 may be derived directly from the digital input signal, for example based on a certain bit, such as the most significant bit (MSB) of the input signal. According to this example, when the MSB is high the VVPS 104 will provide the higher supply voltage to the power amplifier 106; when the MSB is low the VVPS will provide the lower supply voltage to the power amplifier 106.

It will be appreciated that further bits of accuracy may be provided to the control signal 103, for example when using multiple power supply rails or voltage levels for powering the power amplifier 106, by using additional comparators and corresponding threshold values.

Figure 14:
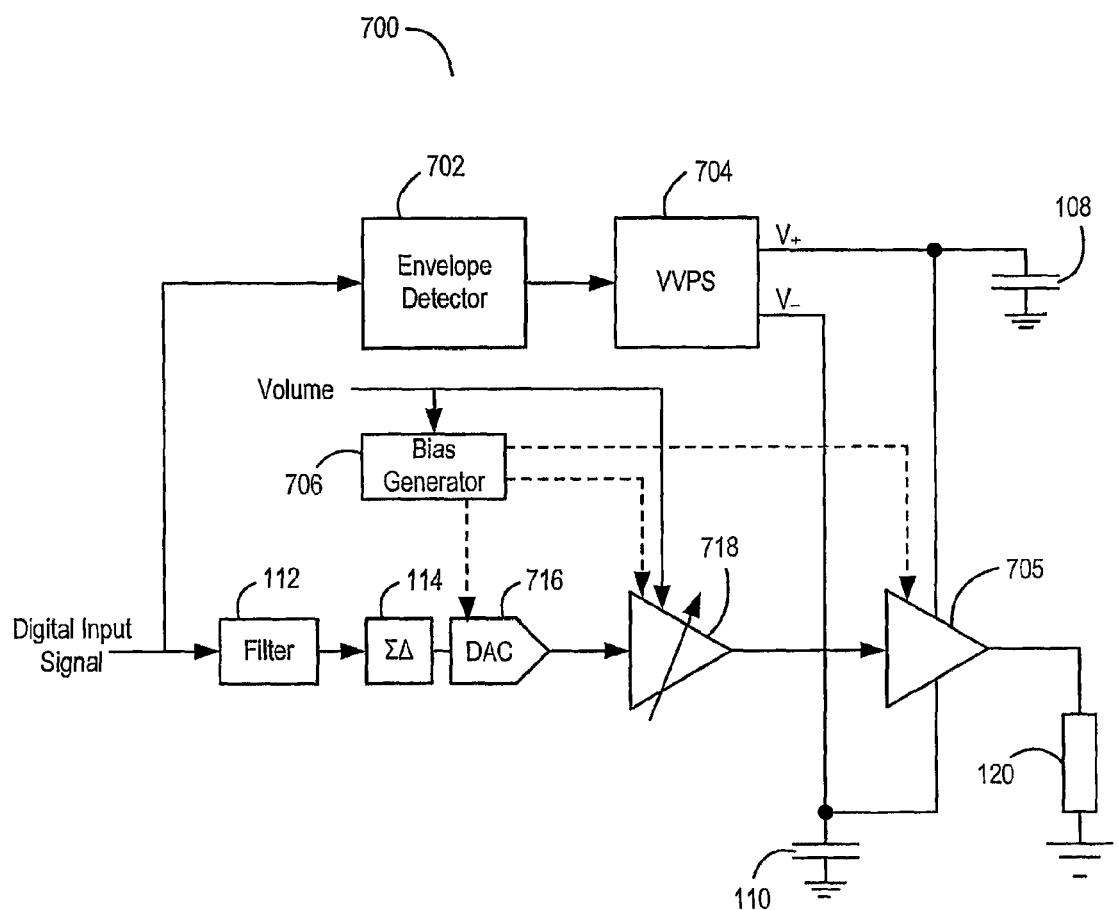
FIG. 14 shows an amplifier according to another aspect of the present invention.
Figure 15:
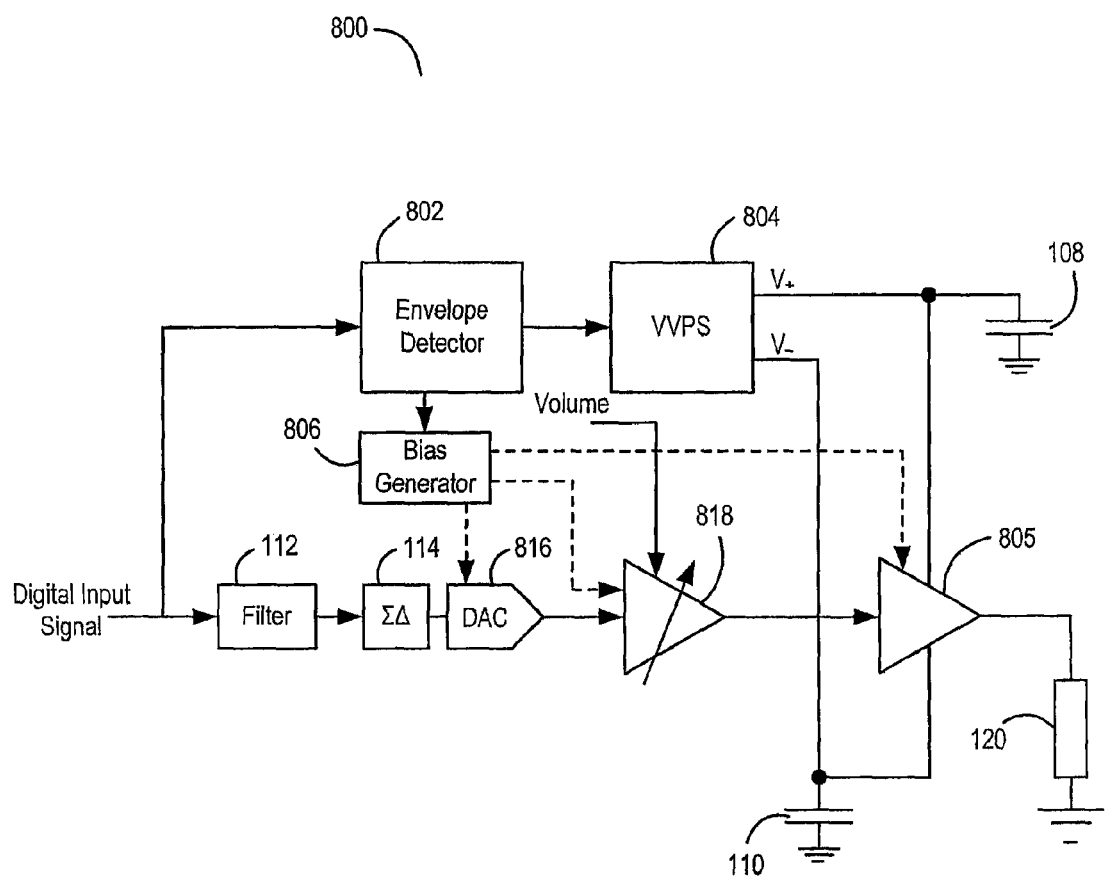
FIG. 15 shows an amplifier according to another aspect of the present invention.

The variable voltage power supply 104 may take any one of a number of forms familiar to those skilled in the art. The VVPS 104 may be a charge pump, a DC-DC converter, or other switched-mode power supply. Further, although the VVPS 104 shown is a switched power supply, the amplifier 100 may use a non-switched power supply (e.g. a linear regulator). Also, the VVPS 104 shown in FIG. 6 provides a positive and a negative voltage output to the power amplifier; however, this is not necessary. The VVPS may supply only one voltage to the power amplifier. FIGS. 14 and 15, described below, illustrate two charge pumps that may be used as the VVPS 104.

Figure 7:
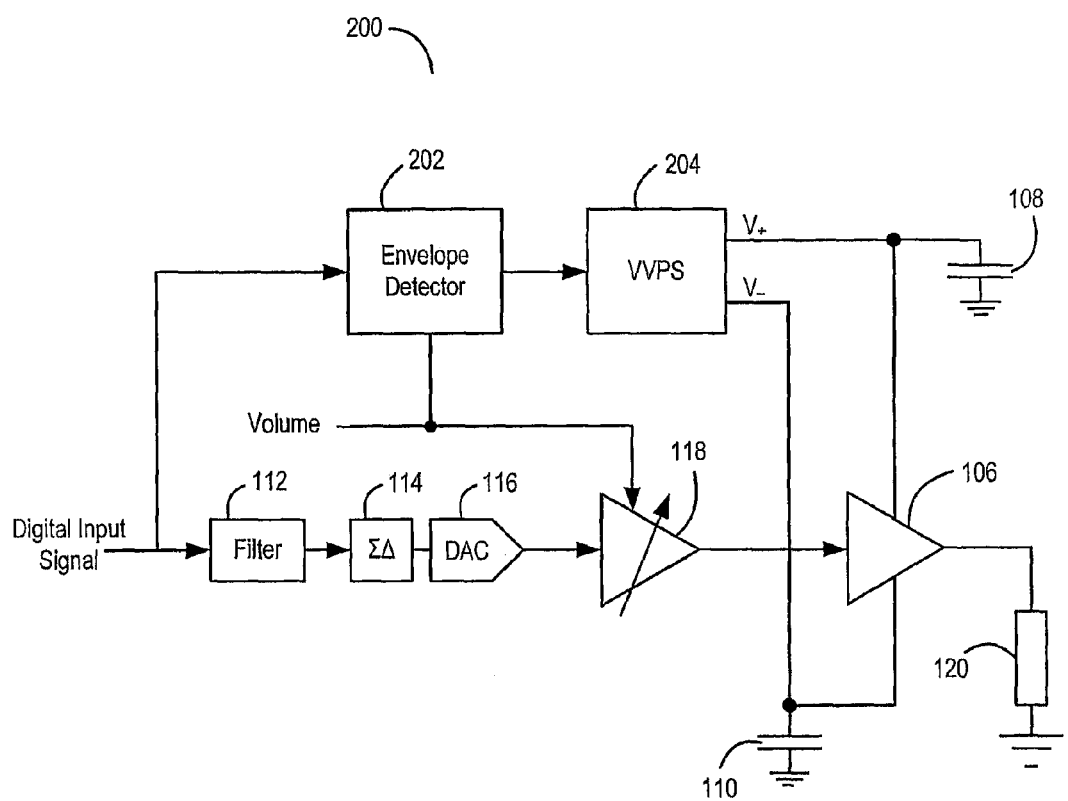
FIG. 7 shows an amplifier.

FIG. 7 shows another amplifier 200.

The amplifier 200 is similar to the amplifier 100 described with respect to FIG. 6, with the exception of a number of components which will be described in more detail below. Components which are common to both amplifiers 100, 200 have retained their original reference numerals and will not be described further. The envelope detector 202 and VVPS 204 act in a similar way to their counterparts in the amplifier 100; however, the operation of either or both may be adjusted as described below.

In the amplifier 200, the control signal (i.e. volume signal) which is applied to the preamplifier 118 in order to set the variable gain in the preamplifier 118, is also used to adjust the voltages supplied to the power amplifier 106.

As described above, the variable gain applied in the preamplifier 118 is typically an attenuation in order to improve the signal-to-noise ratio. However, in the amplifier 100 the envelope detection, and therefore the voltages supplied to the power amplifier 106, is based on the full input signal. All of the gain in the system is present after the envelope detection. Thus, in the event that the volume results in an attenuation, there will be power wastage; if the volume results in a gain, there will be clipping of the signal output from the power amplifier 106.

There are a number of ways of achieving the application of volume to the envelope detection.

The input signal may be modified by the volume control signal before entering the envelope detector 202, such that the volume is already accounted for in the detected envelope (for example, the input signal may be multiplied by the volume signal).

Alternatively, the control signal output from the envelope detector 202 to the VVPS 204 may be modified by the volume, such that the VVPS 204 can adjust its voltage output accordingly (for example, the control signal may be multiplied by the volume). This latter method has the advantage of increasing the resolution of the system; the envelope detector 202 can use the full input signal to detect the envelope. Alternatively, the detecting mechanism of the envelope detector 202 may be adapted by the volume, in order to output a control signal that is adjusted for the volume. In a further alternative method, the output of the VVPS 204 may be adapted by the volume, so that the voltages supplied to the power amplifier 106 are adjusted for the volume.

The discussion above has described the application of the volume control signal not only to the pre-amplifier 118, as is conventional in order to set the variable gain within the preamplifier 118, but also to the envelope detection of the input signal. However, it will also be apparent to one skilled in the art that the variable gain itself may be applied to the envelope detection of the input signal. References above and below to adapting or modifying a quantity or signal "based on the volume" also therefore cover adapting that quantity or signal based on the variable gain; the variable gain in the pre-amplifier by definition varies in accordance with the volume control signal, and thus varying or modifying a quantity or signal based on the variable gain is equivalent to indirectly varying or modifying that quantity or signal based on the volume.

The concept described above of applying volume to envelope detection in an amplifier, has so far been discussed, only in relation to a digital input signal and a mixed-signal amplifier. However, it may easily be seen by one skilled in the art that application of volume gain to envelope detection will equally have benefits in a system with an analogue input signal and an analogue amplifier, as described with reference to FIG. 4. For example, in the amplifier 50, the volume may be applied either before, during or after the envelope detection in envelope detector 52, as described earlier with reference to amplifier 200 and FIG. 7.

Figure 8:
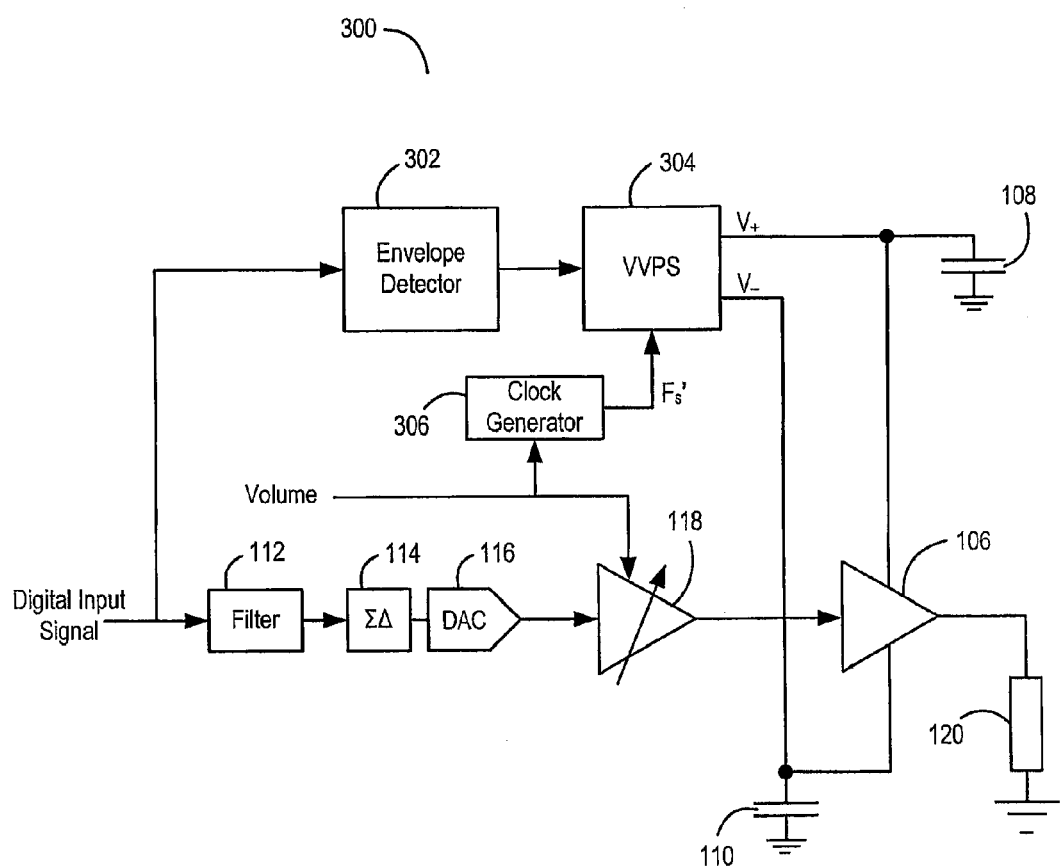
FIG. 8 shows a further amplifier.

FIG. 8 shows another amplifier 300.

The amplifier 300 is similar to the amplifier 100 described with respect to FIG. 6, with the exception of a number of components which will be described in more detail below. Components which are common to both amplifiers 100, 300 have retained their original reference numerals and will not be described further. The envelope detector 302 and VVPS 304 act in a similar way to their counterparts in the amplifier 100; however, the operation of either or both may be adjusted as described below.

Figure 5:
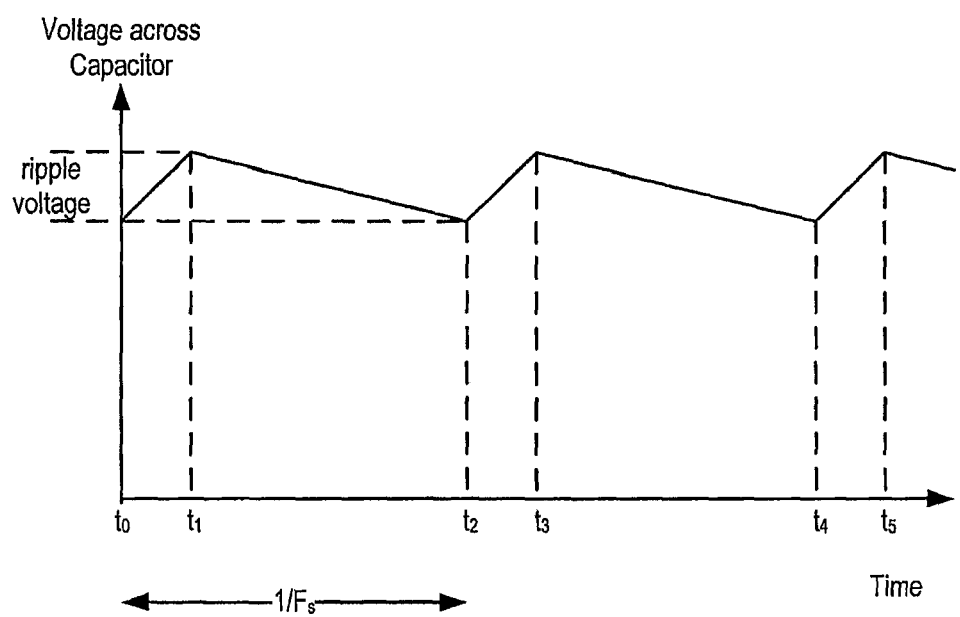
FIG. 5 is a schematic graph modelling the voltage across one of the capacitors in FIG. 4.

Similarly to the amplifiers described previously, the capacitors 108, 110 are charged when the VVPS 104 is switched on, and discharged when the VVPS 104 is switched off. As stated above, the magnitude of the rise and fall of the voltage across the capacitors 108, 110 is known as the "ripple voltage" (see FIG. 5).

In order to reduce the ripple voltage across the capacitors 108, 110, the switching frequency of the VVPS 304, $F_s$, may be increased so that the capacitors 108, 110 do not discharge as much before being recharged. However, increasing the switching frequency $F_s$ will result in greater power consumption within the VVPS 304 itself, as it will be switched on a greater number of times in a given period.

The rate of discharge of the capacitors 108, 110 is dependent on the amount of power that is dissipated in the load 120, which is in turn dependent on the signal amplified by the power amplifier 106. Before the signal reaches the power amplifier 106, its envelope is detected and a variable gain (as set by the volume control signal) is applied to the input signal of the pre-amplifier 118. Both of these factors (i.e. the signal envelope and the volume) have an effect on the signal that is input to the power amplifier 106.

The amplifier 300 comprises a clock generator 306, that receives the volume control signal and generates a clock signal with a frequency $F_s'$. The frequency $F_s'$ of the clock signal is adapted to be relatively high when the volume is relatively high, and relatively low when the volume is relatively low. The clock signal is output to the VVPS 304, such that the VVPS 304 switches at the frequency $F_s'$. Therefore, at higher volumes, where the current drawn in the load 120 is high, and thus the capacitors 108; 110 discharge relatively rapidly, the switching frequency $F_s'$ of the VVPS 304 is also high. This means the voltage across the capacitors 108, 110 is maintained at an adequate level.

Conversely, if the volume is relatively low, less current will be drawn in the load 120, and therefore the voltage across the capacitors 108, 110 will discharge relatively slowly. In this instance, the switching frequency $F_s'$ may be lower, as the capacitors 108, 110 will not need to be charged as frequently, and therefore power is saved. Although the embodiment of FIG. 8 is described as having first and second switching frequencies, it will be appreciated that multiple switching frequencies may be adopted.

Figure 9:
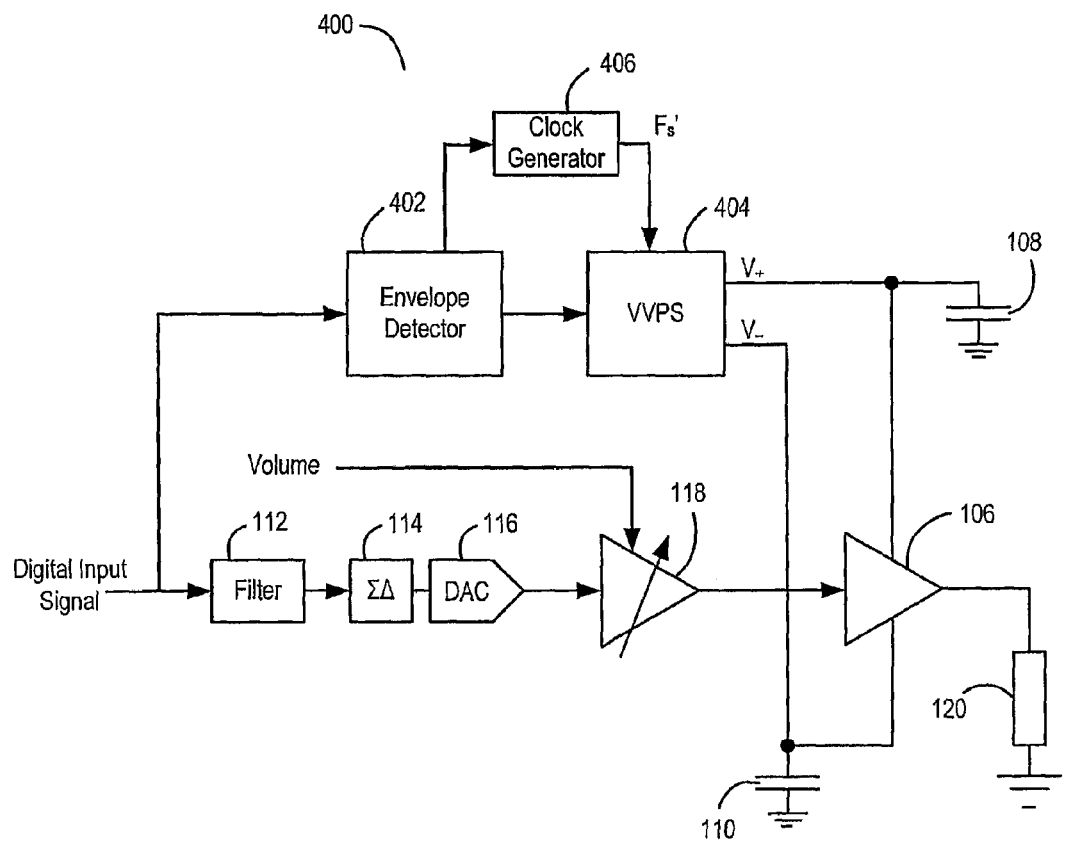
FIG. 9 shows a yet further amplifier.

FIG. 9 shows a further amplifier 400.

The amplifier 400 is similar to the amplifier 100 described with respect to FIG. 6, with the exception of a number of components which will be described in more detail below. Components which are common to both amplifiers 100, 400 have retained their original reference numerals and will not be described further. The envelope detector 402 and VVPS 404 act in a similar way to their counterparts in the amplifier 100; however, the operation of either or both may be adjusted as described below.

As described above, for a given load 120, the amount of current drawn in the load 120 depends on the size of the envelope of the input signal. In view of this, the amplifier 400 comprises a clock generator 406 that receives a further control signal from the envelope detector 402. The clock generator 406 generates a clock signal with a frequency $F_s'$. The clock signal is output to the VVPS 404, such that the VVPS 404 switches at the frequency $F_s'$. Therefore, when the signal envelope is large, the current drawn in the load 120 will be high, and thus the capacitors 108, 110 will discharge relatively rapidly. Therefore, the switching frequency $F_s'$ of the VVPS 404 is also high, such that the voltage across the capacitors 108, 110 is maintained at an adequate level.

Conversely, if the signal envelope is relatively low, less current will be drawn in the load 120, and therefore the voltage across the capacitors 108, 110 will discharge relatively slowly. In this instance, the switching frequency $F_s'$ may be lower, as the capacitors 108, 110 will not need to be charged as frequently, and therefore power is saved. Although the embodiment of FIG. 9 is described as having first and second switching frequencies, it will be appreciated that multiple switching frequencies may be adopted.

Both amplifiers 300, 400 may be adapted so that the switching frequency of the VVPS 304, 404 takes into account both the signal envelope and the volume. This may be achieved in a number of ways. For example, the volume may be applied to the envelope detector 302, 402 as described with reference to FIG. 7. That is, in amplifier 400 the signal may be modified by the volume before the envelope is detected in the envelope detector 402 (for example, the signal may be multiplied by the volume); or the control signal output from the envelope detector 402 to the clock generator 406 may be modified by the volume (for example, the control signal may be multiplied by the volume). In amplifier 300, the envelope detector 302 may output a control signal to the clock generator 306 such that both the envelope and the volume are taken into account when generating the clock signal. The person skilled in the art will be able to think of a multitude of ways in which the volume, the envelope, and their combination may be used to alter the switching frequency of the VVPS.

Further, it may easily be seen by one skilled in the art that application of volume, signal envelope, or their combination to the switching frequency will equally have benefits in a system with an analogue input signal and an analogue amplifier. Thus, an analogue amplifier, for example as described with reference to FIG. 4, would comprise a clock generator as described with reference to FIGS. 8 and 9, and operate in essentially the same way.

Two sources of power losses in switching power supplies are conduction losses and switching losses. Conduction losses relate to the power dissipated by each switch of the switching power supply, and switching losses relate to the power dissipated in switching, i.e. driving, each switch. Typically switching power supplies use MOSFETs as the switching elements. A large MOSFET has a lower channel resistance, i.e. drain-source resistance $R_{DS}$, than a relatively smaller MOSFET for a given current. However, because of its relatively larger gate area, a large MOSFET will require a higher gate charge which results in greater switch driver current losses, i.e. switching losses, than smaller MOSFETs, for a given frequency of operation. While switching losses are typically less significant than conductive losses at high output currents, switching losses lead to significant inefficiencies at low output currents.

Thus, each time the VVPS is switched, the internal switches of the charge pump, for example, typically used to adjust the output voltage of the charge pump, expend some energy. This switching-loss energy is equal to $\frac{1}{2}CV^2$, where C is the capacitance of the switch, and V the voltage across the switch. Thus, in addition to being switched on a higher percentage of the time, the mere act of switching expends energy.

As mentioned above, the MOSFET switches in the VVPS have an inherent gate capacitance and an inherent channel resistance $R_{DS}$. Resistance $R_{DS}$ is proportional to L/W, where L is the channel length of the MOSFET switch and W its channel width. The gate capacitance is proportional to the product WL.

$$R \propto L/W$$

$$C \propto WL$$

Therefore, increasing the width of a MOSFET switch increases its gate capacitance, and decreases its resistance. Decreasing the width has the opposite effect.

Many different types of switch may be used in the VVPS, e.g. single MOSFETs, transmission gates (i.e. NMOS and PMOS transistors), etc. However, the basic principle stated above is the same for each MOS switch type. The energy expended in operating the MOS switch is $\frac{1}{2}CV^2$, and the capacitance is proportional to the gate area (WL) of the switch.

Figure 10:
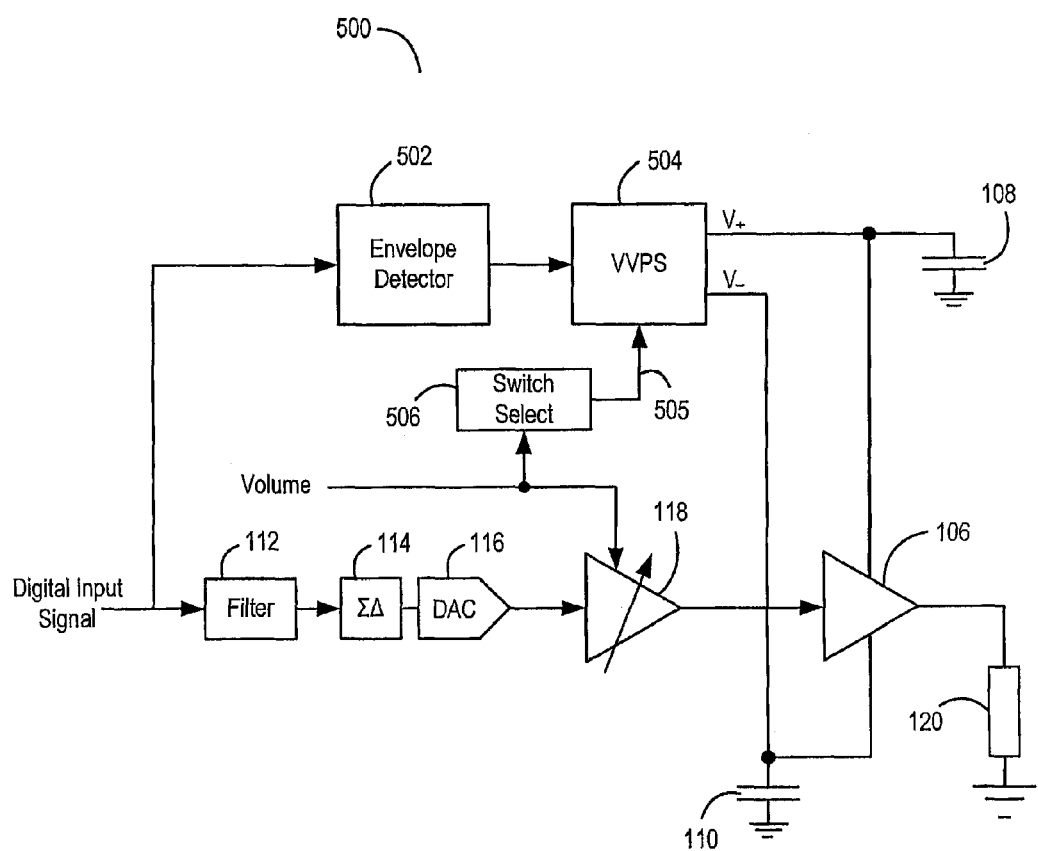
FIG. 10 shows an amplifier according to one aspect of the present invention.

FIG. 10 shows an amplifier 500 according to one aspect of the present invention.

The amplifier 500 is similar to the amplifier 100 described with respect to FIG. 6, with the exception of a number of components which will be described in more detail below. Components which are common to both amplifiers 100, 500 have retained their original reference numerals and will not be described further. The envelope detector 502 and VVPS 504 act in a similar way to their counterparts in the amplifier 100; however, the operation of either or both may be adjusted as described below.

The amplifier 500 further comprises a switch select block 506 that receives the volume control signal and outputs a control signal 505 to the VVPS 504. The control signal 505 directs the VVPS 504 to adapt its switches as will be described in more detail below with reference to FIGS. 11 and 12.

Figure 11:
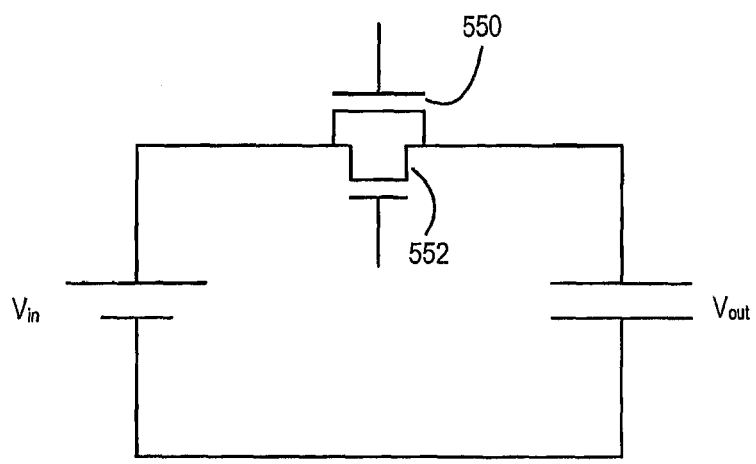
FIG. 11 shows an example of the switches that may be used in the amplifier of FIG. 10.

FIG. 11 shows one example of the switches that may be used in VVPS 504. Two switches 550, 552 are connected in parallel between an input voltage $V_{in}$ and an output voltage $V_{out}$. The first switch 550 is comparatively wide, and therefore has a comparatively low resistance and a high capacitance. The second switch 552 is narrower, and so has a higher resistance but a lower capacitance. In order to output a high voltage, low resistance is required in the switches of the VVPS 504 (i.e. in order to transfer as much as possible of $V_{in}$ across to $V_{out}$). Therefore the wide switch 550 is used in this instance. A greater amount of energy is expended as capacitance C is high, but this is necessary in order to achieve an adequate $V_{out}$.

However, if only a low output voltage is required, the resistance in the switches may be higher. Therefore, in this instance the narrower switch 552 could be used. The capacitance of the narrower switch 552 is lower, so less energy is spent in operating it. Although FIG. 11 shows just two switches, 550, 552 it will be appreciated that multiple switches, each having a different "width", may also be used.

Figure 12:
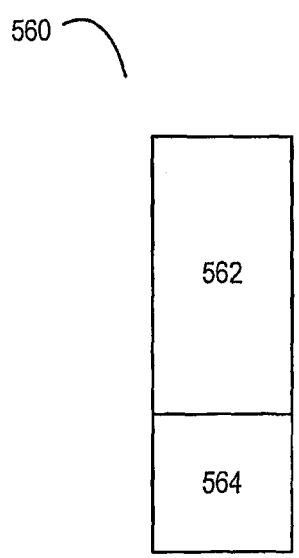
FIG. 12 shows an example implementation of the switches of FIGS. 10 and 11.

FIG. 12 shows one possible implementation of the switches 550 and 552. A single switch 560 may be split unevenly as shown, into regions 562 and 564. This arrangement gives three possible switch widths: the smallest region 564; the larger region 562; and a region combining both 562 and 564. Alternatively, multiple switches may be provided, and different numbers of switches turned on in order to adapt the overall resistance and capacitance to desired values.

It can now be seen how the switch select block 506 in the amplifier 500 operates to reduce the power consumption of the amplifier 500. If the volume is high, a greater amount of voltage will be required in the capacitors 108, 110. Therefore, in this instance, the switch select block 506 directs the VVPS 504 to use relatively wide switches. If the volume is low, less voltage is required in the capacitors 108, 110. In this instance, the switch select block 506 directs the VVPS 504 to use relatively narrow switches, such that the switching losses in the VVPS 504 are minimized.

Figure 13:
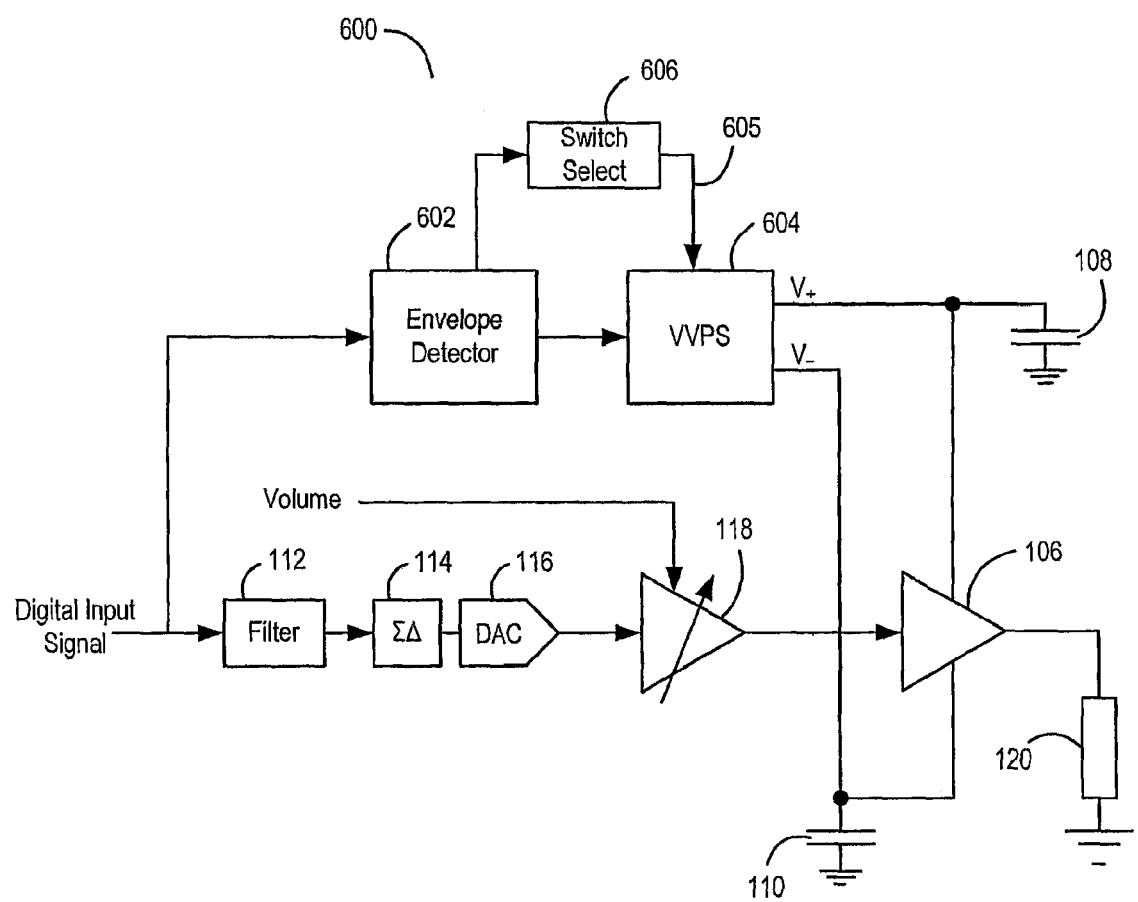
FIG. 13 shows an amplifier according to another aspect of the present invention.

FIG. 13 shows an amplifier 600 according to another aspect of the present invention.

The amplifier 600 is similar to the amplifier 100 described with respect to FIG. 6, with the exception of a number of components which will be described in more detail below. Components which are common to both amplifiers 100, 600 have retained their original reference numerals and will not be described further. The envelope detector 602 and VVPS 604 act in a similar way to their counterparts in the amplifier 100; however, the operation of either or both may be adjusted as described below.

The amplifier 600 further comprises a switch select block 606 that receives a control signal from the envelope detector 602 and outputs a control signal 605 to the VVPS 604. In an alternative arrangement, the switch select block 606 may receive the same control signal as is output to the VVPS 604. The control signal 605 directs the VVPS 604 to adapt its switches as described previously with reference to FIGS. 11 and 12.

If the signal envelope is relatively high, a greater amount of voltage will be required in the capacitors 108, 110. Therefore, in this instance, the switch select block 606 directs the VVPS 604 to use relatively wide switches. If the signal envelope is low, less voltage is required in the capacitors 108, 110. In this instance, the switch select block 606 directs the VVPS 604 to use relatively narrow switches, such that the switching losses in the VVPS 604 are minimized. As above, it will be appreciated that multiple switches may be used, each having a different "width".

Both amplifiers 500, 600 may be adapted so that the switch select block 506, 606 takes into account both the signal envelope and the volume. This may be achieved in a number of ways. For example, the volume may be applied to the envelope detector 502, 602 as described with reference to FIG. 7. That is, in the amplifier 600 the input signal may be modified by the volume before it is detected in the envelope detector 602 (for example, the signal may be multiplied by the volume); or the control signal output from the envelope detector 602 to the switch select block 606 may be modified by the volume (for example, the control signal may be multiplied by the volume); or the control signal 605 output from the switch select block 606 may be modified by the volume signal. In the amplifier 500, the envelope detector 502 may output a further control signal, indicative of the detected input signal envelope, to the switch select block 506 such that both the envelope and the volume are taken into account when generating the switch select control signal. The person skilled in the art will be able to think of a multitude of ways in which the volume, the envelope, and their combination may be used to alter the switches used in the VVPS.

Further, it may easily be seen by one skilled in the art that application of volume, signal envelope, or their combination to a switch select block will equally have benefits in a system with an analogue input signal and an analogue amplifier. Thus, an analogue amplifier, for example as described with reference to FIG. 4, would comprise a switch select block as described with reference to FIGS. 10 and 13, and operate in essentially the same way.

FIG. 14 shows an amplifier 700 according to another aspect of the present invention.

The amplifier 700 is similar to the amplifier 100 described with respect to FIG. 6, with the exception of a number of components which will be described in more detail below. Components which are common to both amplifiers 100, 700 have retained their original reference numerals and will not be described further. The envelope detector 702, VVPS 704, DAC 716, preamplifier 718 and power amplifier 705 act in a similar way to their counterparts in the amplifier 100; however, the operation of any or all may be adjusted as described below.

The DAC 716, preamplifier 718 and power amplifier 705 are equipped with input ports (not shown) for the provision of bias. A higher bias is used to improve the noise, linearity and distortion performance of the DAC, preamplifier and power amplifier elements. The bias may be a current or a voltage, as will be familiar to those skilled in the art. Higher bias results in higher overall power dissipation in both quiescent and active states of the amplifier 700.

The amplifier 700 therefore further comprises a bias generator 706 for generating at least one bias (shown as dashed lines), and providing that bias to at least one of the DAC 716, preamplifier 718 and power amplifier 705; however, the bias may be provided to all, or any combination of the DAC 716, preamplifier 718 and power amplifier 705. Further, the bias generator 706 may generate more than one bias, with different biases being provided to different respective elements. Further, the playback path in the amplifier 700 (i.e. the path containing the filter 112, ΣΔ modulator 114, DAC 716, preamplifier 718, power amplifier 705 and load 120) may contain other components comprising inputs for the provision of bias. It shall be understood by those skilled in the art that the present invention applies equally to these components also.

If a signal to be amplified in the power amplifier 705 is relatively small, the linear range of the DAC 718, preamplifier 718 and power amplifier 705 elements can be effectively reduced while maintaining distortion levels and reducing the power dissipated in each element. Therefore, in addition to the volume signal being supplied to the preamplifier 718, the volume signal is also supplied to the bias generator 706. If the volume signal is relatively high, the signal to be amplified in the power amplifier 705 will also be relatively high; in this instance, therefore, the bias generator 706 will generate a relatively high bias. If the volume signal is relatively low, the signal to be amplified in the power amplifier 705 will also be relatively low; in this instance, therefore, the bias generator 706 will generate a relatively low bias, lowering the power dissipation of the amplifier 700.

FIG. 15 shows a further amplifier 800 according to another aspect of the present invention.

The amplifier 800 is similar to the amplifier 100 described with respect to FIG. 6, with the exception of a number of components which will be described in more detail below. Components which are common to both amplifiers 100, 800 have retained their original reference numerals and will not be described further. The envelope detector 802, VVPS 804, DAC 816, preamplifier 818 and power amplifier 805 act in a similar way to their counterparts in the amplifier 100; however, the operation of any or all may be adjusted as described below.

Again, the DAC 816, preamplifier 818 and power amplifier 805 are equipped with input ports (not shown) for the provision of bias. As before, a higher bias is used to improve the noise, linearity and distortion performance of the DAC, preamplifier and power amplifier elements. The bias may be a current or a voltage, as will be familiar to those skilled in the art. Higher bias results in higher overall power dissipation in both quiescent and active states of the amplifier 800.

The amplifier further comprises a bias generator 806 for generating at least one bias (shown as dashed lines), and providing that bias to at least one of the DAC 816, preamplifier 818 and power amplifier 805; however, the bias may be provided to all, or any combination of the DAC 816, preamplifier 818 and power amplifier 805. Further, the bias generator 806 may generate more than one bias, with different biases being provided to different respective elements. Further, the playback path in the amplifier 800 (i.e. the path containing the filter 112, ΣΔ modulator 114, DAC 816, preamplifier 818, power amplifier 805 and load 120) may contain other components comprising inputs for the provision of bias. It shall be understood by those skilled in the art that the present invention applies equally to these components also.

The bias generator 806 receives a control signal from the envelope detector 802, the control signal being indicative of the size of the input digital signal (i.e. the envelope). If the input digital signal is relatively high, the signal to be amplified in the power amplifier 805 will also be relatively high; in this instance, therefore, the bias generator 806 will generate a relatively high bias. If the volume signal is relatively low, the signal to be amplified in the power amplifier 805 will also be relatively low; in this instance, therefore, the bias generator 806 will generate a relatively low bias, lowering the power dissipation of the amplifier 800.

Both amplifiers 700, 800 may be adapted so that the bias generator 706, 806 takes into account both the signal envelope and the volume. This may be achieved in a number of ways. For example, the volume may be applied to the envelope detector 702, 802 as described with reference to FIG. 7. That is, in the amplifier 800 the input signal may be modified by the volume before it is detected in the envelope detector 802 (for example, the signal may be multiplied by the volume); or the control signal output from the envelope detector 802 to the bias generator 806 may be modified by the volume (for example, the control signal may be multiplied by the volume); or the bias output from the bias generator 806 may be modified by the volume signal. In the amplifier 700, the envelope detector 702 may output a further control signal, indicative of the detected input signal envelope, to the bias generator 706 such that both the envelope and the volume are taken into account when generating the switch select control signal. The person skilled in the art will be able to think of a multitude of ways in which the volume, the envelope, and their combination may be used to alter the bias generated in the bias generator 706, 806.

Further, it may easily be seen by one skilled in the art that application of volume, signal envelope, or their combination to the bias applied to elements in the playback path of an amplifier will equally have benefits in a system with an analogue input signal and an analogue amplifier. Thus, an analogue amplifier, for example as described with reference to FIG. 4, would comprise a bias generator as described with reference to FIGS. 14 and 15, and operate in essentially the same way. However, of course in this instance there would be no DAC in the playback path and so the bias would not be applied to a DAC.

Figure 16:
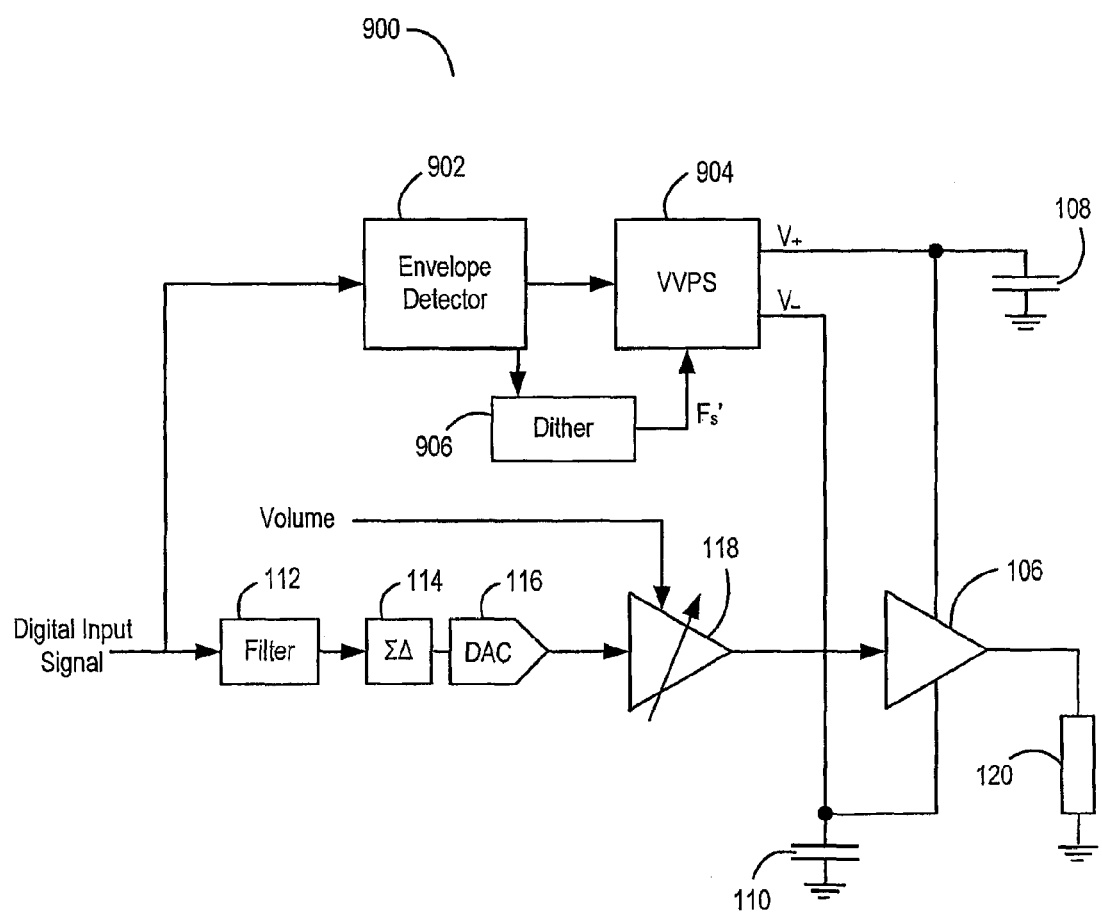
FIG. 16 shows an amplifier according to another aspect of the present invention.

FIG. 16 shows an amplifier 900 according to another aspect of the present invention.

The amplifier 900 is similar to the amplifier 100 described with respect to FIG. 6, with the exception of a number of components which will be described in more detail below. Components which are common to both amplifiers 100, 900 have retained their original reference numerals and will not be described further. The envelope detector 902 and VVPS 904 act in a similar way to their counterparts in the amplifier 100; however, the operation of either or both may be adjusted as described below.

As described previously, FIG. 5 shows the voltage across the capacitors 108, 110 providing supply voltages to the power amplifier 106. The voltage across the capacitors 108, 110 rises and falls periodically as the VVPS 904 is switched on and off at a certain clock frequency, giving rise to a "ripple voltage". A problem with such systems is that the ripple voltage tends to generate "tones" at the clock frequency and its harmonics. The greater the ripple voltage, the greater the amplitude of the tones created. In general, such tones are undesirable and may disturb the operation of other systems on the chip. In audio applications, such tones may mix into audio frequencies, and be audible to the user.

A standard method of reducing the tones caused by switching in the power supply is to dither the switching frequency. That is, by adding a noise signal to the clock signal, the switching frequency may be continuously adjusted slightly up or down. This has the effect of "spreading out" the energy generated at the clock frequency and its harmonics to cover a broader range of frequencies around those discrete values. This lessens the amplitude of the tones, reducing their impact on other systems and the end user.

However, power is required to generate dither. This is particularly a disadvantage in portable applications, where battery life is an important consideration for manufacturers. In addition, the dither added to the switching frequency may actually cause unwanted noise in the other systems on the chip, i.e. because the power supply 904 is not switching at the "optimum" frequency.

At relatively low input signal amplitudes the amount of power dissipated in the load 120 is also relatively low. This means that the amount of voltage discharged from the capacitors 108, 110 per clock cycle is also low, i.e. the ripple voltage is small. As described above, the amplitude of the ripple voltage is linked to the amplitude of the tones caused as a result of that ripple voltage. A large ripple voltage results in large tones, and vice versa. Therefore, large, signal amplitudes result in large tones, and small signal amplitudes result in small tones.

According to the present invention, the amplifier 900 further comprises a dither block 906. The dither block 906 receives a dither control signal from the envelope detector 902 and generates a clock signal for the VVPS 904 at frequency $F_s'$.

The dither block 906 comprises a frequency synthesizer capable of generating a clock signal, as will be apparent to those skilled in the art, for example, frequency-locked loop (FLL) or phase-locked loop (PLL) circuits, etc. Further, the dither block comprises some means for dithering the frequency of the clock signal so generated. For example, one or more random number generators may be used to slightly randomize the division ratio in the feedback path of a FLL or PLL. Examples of random number generators that could be used include a linear feedback shift register, or a loop circuit with an unstable feedback loop. A person skilled in the art may think of many such means for creating a dithered clock signal within the scope of the claims appended hereto. It will also be apparent to those skilled in the art that alternative arrangements are possible within the scope of the claims. For example, the clock synthesizer could be present in a separate block, or incorporated within the switched power supply 904. Further operation of the dither block 906 is described below.

According to the present invention, the dither block 906 receives a dither control signal from the envelope detector 902, indicative of the amplitude (i.e. envelope) of the input signal. If the input signal has a first amplitude, for example a relatively high signal amplitude, the dither block 906 operates in a first mode of operation. For example, the first mode of operation may be a "normal" mode of operation, i.e. whereby the dither block 906 generates a dithered clock signal. If the input signal has a second amplitude, for example a relatively low signal amplitude, the dither block 906 operates in a second mode of operation, for example whereby the dithering of the clock signal is reduced. In order to achieve this reduction of dithering, the amplitude of the dither signal may be reduced, or the frequency with which the dither signal is altered may be reduced. In one embodiment, the dithering of the clock signal is switched off altogether when the input signal amplitude is relatively small, for example when the amplitude of the input signal is less than a predetermined threshold value. In an alternative embodiment, the operation of the dither signal is a continuous function of the amplitude of the input signal, i.e. the amplitude or frequency of the dither signal varies continuously with the amplitude of the input signal.

The dithering of the clock signal may be reduced when the input signal is low because the ripple voltage is low at such signal amplitudes. This means that tones are less of a problem, and so dithering is not required. Indeed, reducing the dither saves power and also reduces the noise caused in other systems on the chip.

Figure 17:
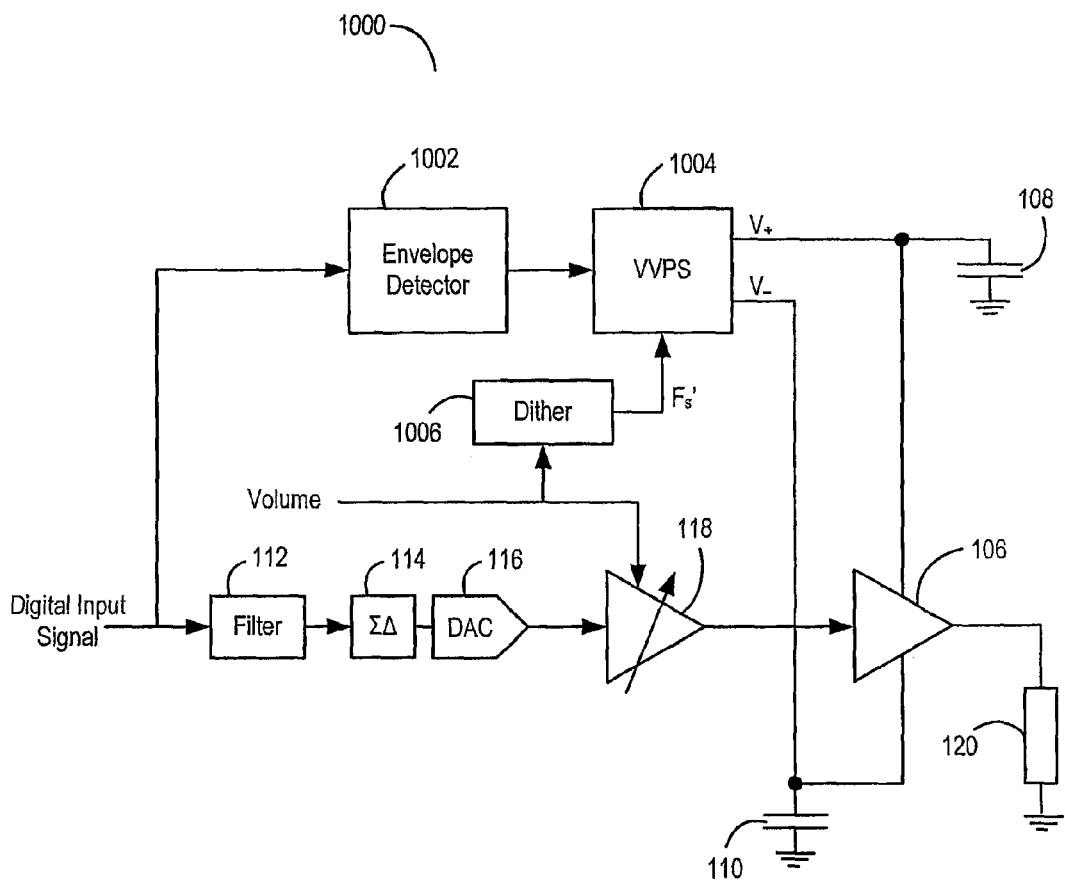
FIG. 17 shows an amplifier according to another aspect of the present invention.

FIG. 17 shows an amplifier 1000 according to another aspect of the present invention.

The amplifier 1000 is similar to the amplifier 900 described with respect to FIG. 6, with the exception of a number of components which will be described in more detail below. Components which are common to both amplifiers 900, 1000 have retained their original reference numerals and will not be described further. The envelope detector 1002 and VVPS 1004 act in a similar way to their counterparts in the amplifier 900; however, the operation of either or both may be adjusted as described below.

According to the present invention, the amplifier 1000 further comprises a dither block 1006. The dither block 1006 receives the volume signal and generates a clock signal for the VVPS 1004 at frequency $F_s'$.

As described above, the amplitude of the signal that is output to the load 120 affects the size of the ripple voltage in the capacitors 108, 110, and therefore the amplitude of the tones created at the switching frequency. One factor that affects the amplitude of the signal in the load 120, taken into account above, is the amplitude (i.e. envelope) of the input signal. Another factor that affects the amplitude of the signal in the load 120 is the volume signal, representative of the gain applied in the preamplifier 118.

Therefore, according to the present invention, the dither block 1006 also receives the volume signal in addition to the pre-amplifier 118. If the volume is relatively high, the dither block 1006 operates in a first mode of operation, for example a "normal" mode of operation, i.e. whereby the dither block 1006 generates a dithered clock signal. If the volume is relatively low, the dither block 1006 operates in a second mode of operation, for example whereby the dithering of the clock signal is reduced. In order to achieve this reduction of dithering, the amplitude of the dither signal may be reduced, or the frequency with which the dither signal is altered may be reduced. In one embodiment, the dithering of the clock signal is switched off altogether when the volume is relatively small, for example when the volume is less than a predetermined threshold value. In an alternative embodiment, the operation of the dither signal is a continuous function of the volume, i.e. the amplitude or frequency of the dither signal varies continuously with the volume.

Both amplifiers 900, 1000 may be adapted so that the dither block 906, 1006 takes into account both the signal envelope and the volume. This may be achieved in a number of ways. For example, the volume may be applied to the envelope detector 902, 1002 as described with reference to FIG. 7. That is, in the amplifier 900 the input signal may be modified by the volume before it is detected in the envelope detector 902 (for example, the signal may be multiplied by the volume); or the dither control signal output from the envelope detector 902 to the dither block 906 may be modified by the volume (for example, the control signal may be multiplied by the volume). In the amplifier 1000, the envelope detector 1002 may output a further control signal, indicative of the detected input signal envelope, to the dither block 1006 such that both the envelope and the volume are taken into account when generating the dithered clock signal. The person skilled in the art will be able to think of a multitude of ways in which the volume, the envelope, and their combination may be used to alter the dither generated in the dither block 906, 1006.

Further, it may easily be seen by one skilled in the art that application of volume, signal envelope, or their combination to the dithering of the switching frequency will equally have benefits in a system with an analogue input signal and an analogue amplifier. Thus, an analogue amplifier, for example as described with reference to FIG. 4, would comprise a dither block as described with reference to FIGS. 16 and 17, and operate in essentially the same way.

Figure 18A:
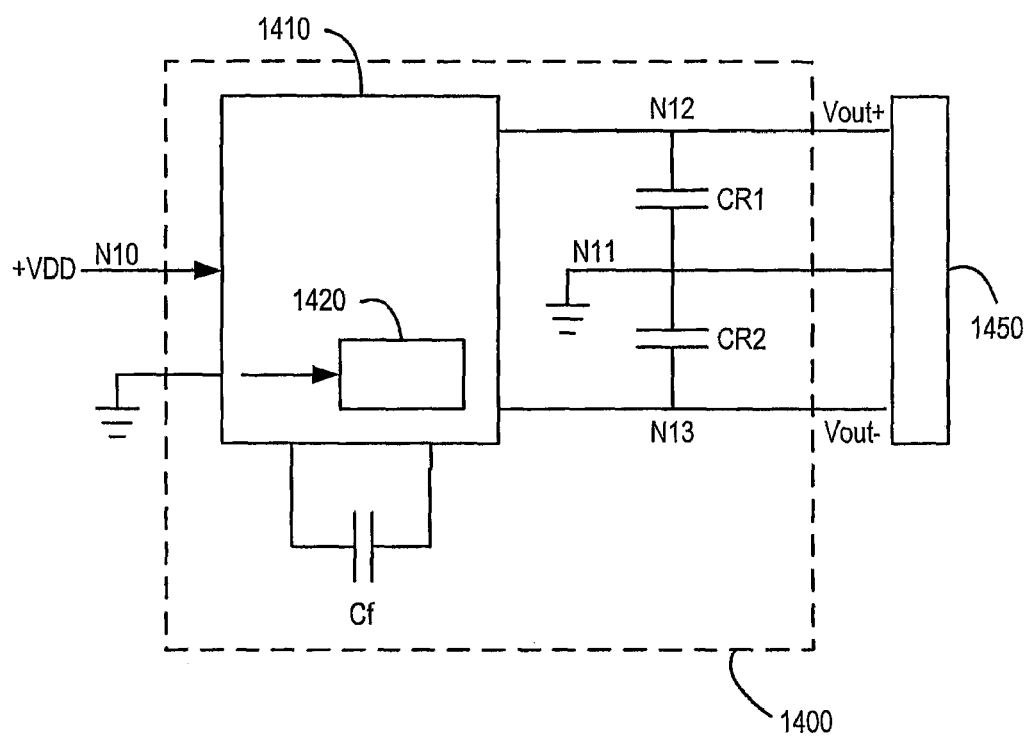
FIGS. 18a and 18b show a first charge pump suitable for use with any of the amplifiers of the present invention.

FIG. 18*a* shows a charge pump 1400 that is suitable for use as the VVPS 104, 204, 304, 404, 504, 604, 704, 804, 904, 1004 in any of FIGS. 6, 7, 8, 9, 10, 13, 14, 15, 16 and 17 respectively. Further, the charge pump 1400 is also suitable for use as the VVPS in any of the analogue equivalents of the amplifiers 200, 300, 400, 500, 600, 700, 800, 900, 1000.

FIG. 18*a* is a block diagram of a novel inverting charge pump circuit, which we shall call a "Level Shifting Charge-Pump" (LSCP) 1400. There are two reservoir capacitors CR1 and CR2, a flying capacitor Cf and a switch array 1410 controlled by a switch controller 1420. However, in this arrangement, neither of the reservoir capacitors CR1, CR2 are connected directly to the input supply voltage VDD, but only via the switch array 1410. It should be noted that LSCP 1400 is configured as an open-loop charge-pump, although a closed-loop arrangement would be readily appreciated and understood by those skilled in the art. Therefore, LSCP 1400 relies on the respective loads (not illustrated) connected across each output N12-N11, N13-N11 remaining within predetermined constraints. The LSCP 1400 outputs two voltages Vout+, Vout− that are referenced to a common voltage supply (node N11), i.e. ground. Connected to the outputs Vout+, Vout−, N11, and shown for illustration only, is a load 1450. In reality this load 1450 may be wholly or partly located on the same chip as the power supply, or alternatively it may be located off-chip. The load 1450 is a combination of the power amplifier 106 and the load 120.

LSCP 1400 operates such that, for an input voltage +VDD, the LSCP 1400 generates outputs of magnitude +VDD/2 and −VDD/2 although when lightly loaded, these levels will, in reality, be +/−VDD/2-Iload.Rload, where Iload equals the load current and Rload equals the load resistance. It should be noted that the magnitude (VDD) of output voltage across nodes N12 & N13 is the same, or is substantially the same, as that of the input voltage (VDD) across nodes N10 & N11.

Figure 18B:
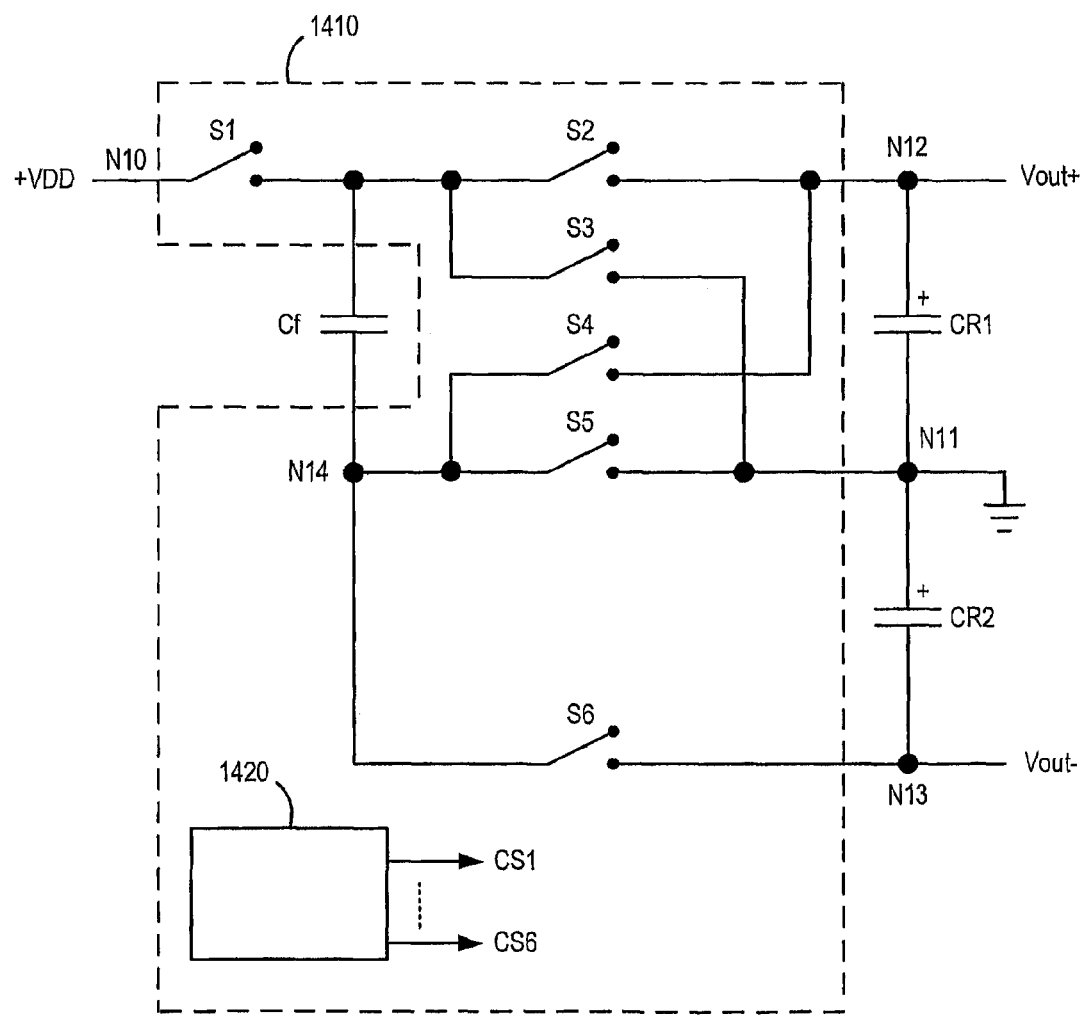

FIG. 18*b* shows a more detailed version of the LSCP 1400 and, in particular, detail of the switch array 1410 is shown. The switch array 1410 comprises six switches S1-S6 each controlled by corresponding control signal CS1-CS6 from the switch controller 1420. The switches are arranged such that first switch S1 is connected between the positive plate of the flying capacitor Cf and the input voltage source, the second switch S2 between the positive plate of the flying capacitor and first output node N12, the third switch S3 between the positive plate of the flying capacitor and common terminal N11, the fourth switch S4 between the negative plate of the flying capacitor and first output node N12, the fifth switch S5 between the negative plate of the flying capacitor and common terminal N11 and the sixth switch S6 between the negative plate of the flying capacitor and second output terminal N13. It should be noted that the switches can be implemented in a number of different ways (for example, MOS transistor switches or MOS transmission gate switches) depending upon, for example, an integrated circuits process technology or the input and output voltage requirements.

Figure 19A:
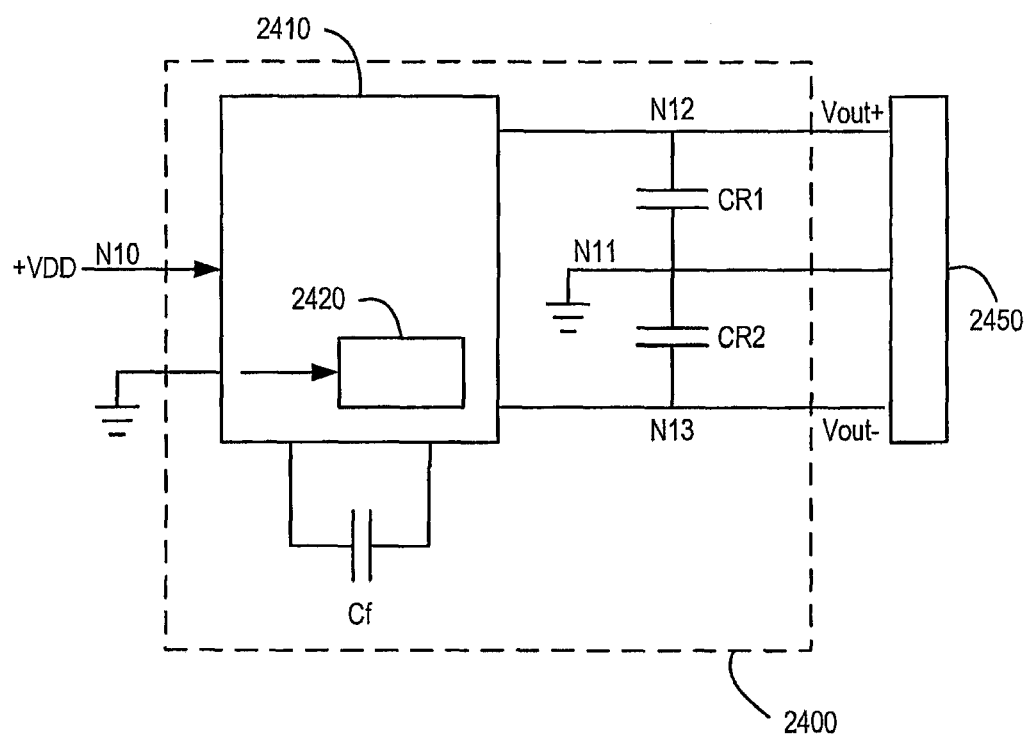
FIGS. 19a and 19b show a second charge pump suitable for use with any of the amplifiers of the present invention.

FIG. 19*a* shows a further charge pump 2400 that is suitable for use as the VVPS 104, 204, 304, 404, 504, 604, 704, 804, 904, 1004 in any of FIGS. 6, 7, 8, 9, 10, 13, 14, 15, 16 and 17 respectively. Further, the charge pump 2400 is also suitable for use as the VVPS in any of the analogue equivalents of the amplifiers 200, 300, 400, 500, 600, 700, 800, 900, 1000.

FIG. 19*a* is a block diagram of a novel inverting charge pump circuit, which we shall call a "Dual Mode Charge Pump" (DMCP) 2400. Again there are two reservoir capacitors CR1 and CR2, a flying capacitor Cf and a switch array 2410 controlled by a switch control module 420 (which may be software or hardware implemented). In this arrangement, neither of the reservoir capacitors CR1, CR2 are connected directly to the input supply voltage VDD, but rather via the switch array 2410.

It should be noted that DMCP 2400 is configured as an open-loop charge-pump, although a closed-loop arrangement would be readily appreciated and understood by those skilled in the art. Therefore, DMCP 2400 relies on the respective loads (not illustrated) connected across each output N12-N11, N13-N11 remaining within predetermined constraints. The DMCP 2400 outputs two voltages Vout+, Vout− that are referenced to a common voltage supply (node N11). Connected to the outputs Vout+, Vout−, N11, and shown for illustration only, is a load 2450. In reality this load 2450 may be wholly or partly located on the same chip as the power supply, or alternatively it may be located off-chip. The load 2450 is a combination of the power amplifier 106 and the load 120.

DMCP 2400 is operable in two main modes. In a first mode the DMCP 400 operates such that, for an input voltage +VDD, the DMCP 2400 generates outputs each of a magnitude which is a mathematical fraction of the input voltage VDD. In the embodiment below the outputs generated in this first mode are of magnitude +VDD/2 and −VDD/2, although when lightly loaded, these levels will, in reality, be +/−VDD/2-Iload.Rload, where Iload equals the load current and Rload equals the load resistance. It should be noted that, in this case, the magnitude (VDD) of output voltage across nodes N12 & N13 is the same, or is substantially the same, as that of the input voltage (VDD) across nodes N10 & N11. In a second mode the DMCP 400 produces a dual rail output of +/−VDD.

Figure 19B:
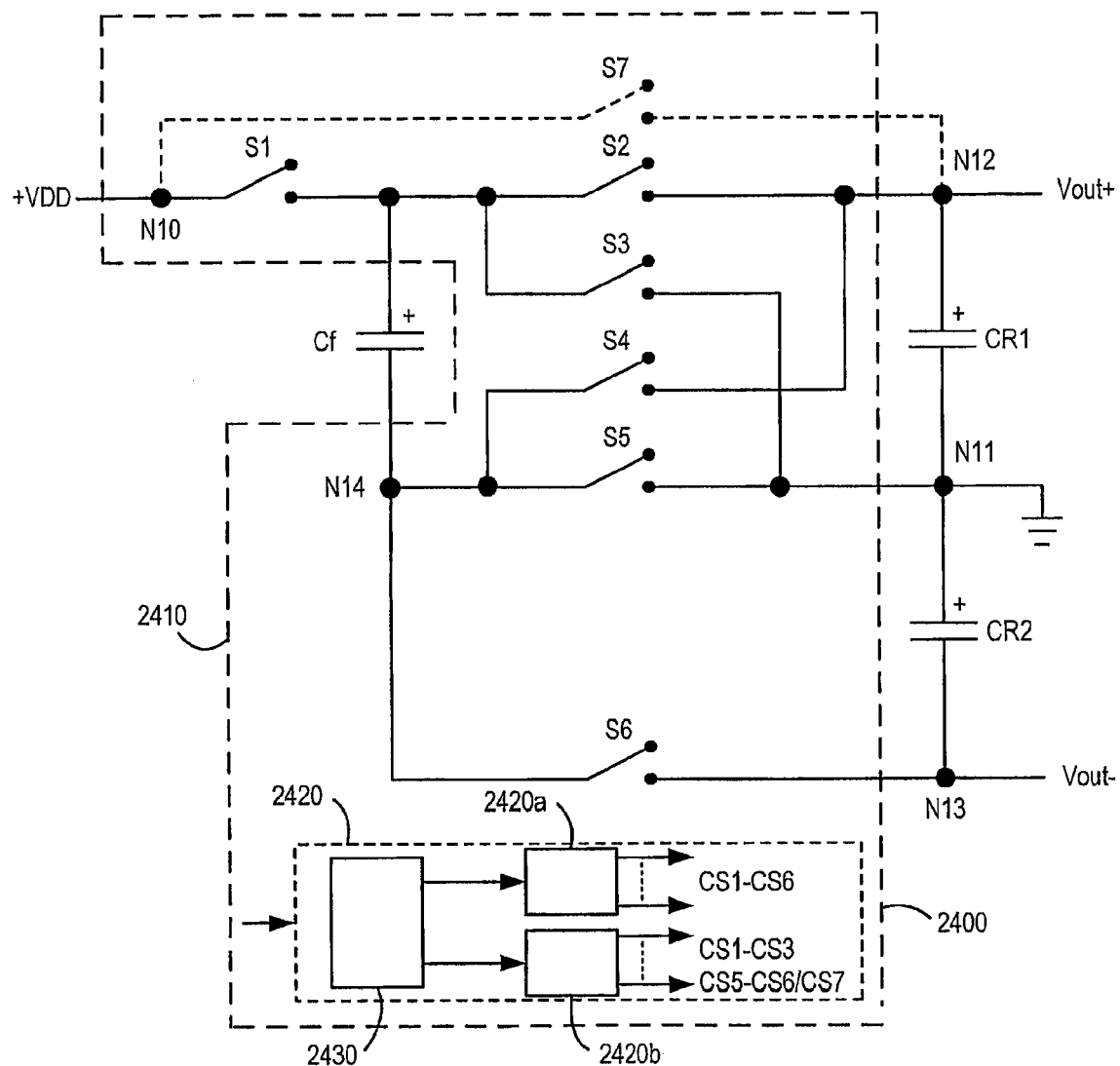

FIG. 19*b* shows a more detailed version of the DMCP 2400 and, in particular, detail of the switch array 2410 is shown. The switch array 2410 comprises six main switches S1-S6 each controlled by corresponding control signal CS1-CS6 from the switch control module 2420. The switches are arranged such that first switch S1 is connected between the positive plate of the flying capacitor Cf and the input voltage source, the second switch S2 between the positive plate of the flying capacitor and first output node N12, the third switch S3 between the positive plate of the flying capacitor and common terminal N11, the fourth switch S4 between the negative plate of the flying capacitor and first output node N12, the fifth switch S5 between the negative plate of the flying capacitor and common terminal N11 and the sixth switch S6 between the negative plate of the flying capacitor and second output node N13. Optionally, there may be provided a seventh switch S7 (shown dotted), connected between the input voltage source (node N10) and first output node N12. Also shown in greater detail is the control module 2420 which comprises mode select circuit 2430 for deciding which controller 2420*a*, 2420*b* or control program to use, thus determining which mode the DMCP operates in. Alternatively, the mode select circuit 2430 and the controllers 2420*a*, 2420*b* can be implemented in a single circuit block (not illustrated).

In the first mode, switches S1-S6 are used and the DMCP 2400 operates in a similar manner to the LSCP 1400. In the second mode, switches S1-S3 and S5-S6/S7 are used, and switch S4 is redundant.

It should be noted that the switches can be implemented in a number of different ways (for example, MOS transistor switches or MOS transmission gate switches) depending upon, for example, an integrated circuit's process technology or the input and output voltage requirements.

The amplifiers described herein are preferably incorporated in an integrated circuit. For example, the integrated circuit may be part of an audio and/or video system, such as an MP3 player, a mobile phone, a camera or a satellite navigation system, and the system can be portable (such as a battery-powered handheld system) or can be mains-powered (such as a hi-fi system or a television receiver) or can be an in-car, in-train, or in-plane entertainment system. Further to the signals identified above, the signals amplified in the amplifier may represent ambient noise for use in a noise cancellation process.

The skilled person will recognize that some of the above-described apparatus and methods may be embodied as processor control code, for example on a carrier medium such as a disk, CD- or DVD-ROM, programmed memory such as read only memory (firmware), or on a data carrier such as an optical or electrical signal carrier. For many applications, embodiments of the invention will be implemented on a DSP (digital signal processor), ASIC (application specific integrated circuit) or FPGA (field programmable gate array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog TM or VHDL (very high speed integrated circuit hardware description language). As the skilled person will appreciate, the code may be distributed between a plurality of coupled components in communication with one another. Where appropriate, the embodiments may also be implemented using code running on a field-(re-)programmable analogue array or similar device in order to configure analogue/digital hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfill the functions of several units recited in the claims. Any reference signs in the claims shall not be construed so as to limit their scope.

What is claimed is:

1. A charge pump circuit comprising:
    a switch array for providing, in use, a plurality of switch connections;
    wherein said charge pump circuit is operable in at least first and second modes, wherein in said first and second modes different combinations of said switch connections are switched in sequence to generate different output voltages in each mode; and
    wherein at least a first switch connection comprises a plurality of parallel switches configured such that the energy required to operate the first switch connection can be varied in use in at least one of said first and second modes.

2. A charge pump circuit as claimed in claim 1 combined with an amplifier to form an audio amplifier circuit.

3. A charge pump circuit as claimed in claim 1 wherein said plurality of parallel switches is configured so that the number of parallel switches used to provide said switch connection can, in use, be varied.

4. A charge pump circuit as claimed in claim 3 wherein said circuit is configured to vary the number of parallel switches used for said switch connection based on a switch control signal.

5. A charge pump circuit as claimed in claim 1 wherein each of said plurality of switch connections comprises a respective plurality of parallel switches.

6. A charge pump circuit as claimed in claim 1 wherein said plurality of parallel switches is configured so that the gate area of the switches used to provide said switch connection can, in use, be varied.

7. A charge pump circuit as claimed in claim 1 wherein said plurality of parallel switches comprises a first switch comprising a plurality of switch regions.

8. A charge pump circuit as claimed in claim 7 wherein at least one of said switch regions has a different gate area to another switch region.

9. A charge pump circuit as claimed in claim 4 wherein said switch control signal varies with a volume control signal.

10. A charge pump circuit as claimed in claim 4 wherein said switch control signal varies in accordance with a variation of an input signal.

11. A charge pump circuit as claimed in claim 4 wherein said switch control signal varies with the envelope of an input signal.

12. A charge pump circuit as claimed in claim 4 wherein said switch control signal varies with the output voltage of the charge pump.

13. A charge pump circuit as claimed in claim 1 wherein said plurality of parallel switches comprise MOSFET switches.

14. A charge pump circuit as claimed in claim 1 wherein said charge pump is operable in first mode to produce a first supply voltage and a second mode to produce a second supply voltage which is different to the first supply voltage.

15. A charge pump circuit as claimed in claim 2 wherein said amplifier circuit is configured, in use, to vary the switching frequency of the charge pump.

16. A charge pump circuit as claimed in claim 1 combined with an amplifier to form an audio amplifier circuit, said audio amplifier circuit comprising part of an audio device.

17. An audio device as claimed in claim 16 wherein said audio device is at least one of: a portable device; an MP3 player; a mobile phone; a camera; a satellite navigation system or an in-car, in-train, or in-plane entertainment system.

18. A charge pump circuit as recited in claim 1 wherein at least a first switch of said switch array is configured such that the gate area of the first switch can be varied in use.

19. A charge pump circuit as claimed in claim 18 wherein said first switch comprises a plurality of parallel switches.

20. A charge pump circuit as claimed in claim 18 wherein said first switch comprises a plurality of switch regions and wherein at least one switch region has a different gate area to another switch region.

21. A charge pump circuit as claimed in claim 1 comprising a switch select block configured to select one or more of said plurality of parallel switches for use in said first switch connection based on a switch control signal.

22. A charge pump circuit as claimed in claim 21 wherein said switch control signal is based on the output voltage.

23. A charge pump circuit as claimed in claim 1 wherein said plurality of parallel switches comprises a first switch comprising a plurality of switch regions.

24. A charge pump circuit as claimed in claim 1 wherein a plurality of said switch connections each comprises a respective plurality of parallel switches.

25. A charge pump circuit comprising:
- a switch array for providing, in use, a plurality of switch connections;
- wherein said charge pump circuit is operable in at least first and second modes, wherein in said first and second modes different combinations of said switch connections are switched in sequence to generate different output voltages in each mode; and
- wherein at least a first switch connection comprises a plurality of parallel switches configured such that the gate area the first switch connection can be varied in use in at least one of said modes.

26. A charge pump circuit for supplying one or more supply voltages to an audio amplifier circuit, said charge pump circuit comprising:
- a switch array for providing, in use, a plurality of switch connections;
- wherein at least a first switch connection comprises a plurality of parallel switches configured such that the energy required to operate the first switch connection can be varied in use; and
- wherein said charge pump circuit is configured to selectively vary the parallel switches used for said first switch connection based on a volume control signal.

27. A charge pump circuit as claimed in claim 26 wherein said charge pump circuit is further configured to selectively vary the parallel switches used for said first switch connection based on the envelope of an input signal for said audio amplifier circuit.

28. A charge pump circuit for supplying one or more supply voltages to an audio amplifier circuit, said charge pump circuit comprising:
- a switch array for providing, in use, a plurality of switch connections;
- wherein at least a first switch connection comprises a plurality of parallel switches configured such that the energy required to operate the first switch connection can be varied in use; and
- wherein said charge pump circuit is configured to selectively vary the parallel switches used for said first switch connection based on a feedforward control signal indicative of the signal to be amplified by the audio amplifier.

29. A charge pump circuit for supplying one or more supply voltages to an audio amplifier circuit, said charge pump circuit comprising:
- a switch array for providing, in use, a plurality of switch connections;
- wherein at least a first switch connection comprises a plurality of parallel switches configured such that the energy required to operate the first switch connection can be varied in use; and
- wherein said charge pump circuit is configured to selectively vary the parallel switches used for said first switch connection based on an input signal for said audio amplifier circuit.

30. A charge pump circuit as claimed in claim 29 wherein said charge pump circuit is configured to selectively vary the parallel switches used for said first switch connection based on the envelope of said input signal.

* * * * *